United States Patent
Wei et al.

Patent Number: 5,430,739
Date of Patent: Jul. 4, 1995

[54] REAL-TIME REED-SOLOMON DECODER

[75] Inventors: Shyue-Win Wei, Chang Hua Hsien; Che-Ho Wei, Hsin Chu, both of Taiwan

[73] Assignee: National Science Council, Taiwan

[21] Appl. No.: 823,822

[22] Filed: Jan. 22, 1992

Related U.S. Application Data

[63] Continuation-in-part of Ser. No. 499,664, Mar. 27, 1990.

[51] Int. Cl.⁶ .................. G06F 11/10; H03M 13/00
[52] U.S. Cl. ............................... 371/37.1; 371/37.5
[58] Field of Search ............... 371/37.1, 37.5, 38.1, 371/39.1, 67.1, 25.1; 364/746.1

[56] References Cited

U.S. PATENT DOCUMENTS

| | | |
|---|---|---|
| 4,191,970 | 3/1980 | Witsenhausen et al. |
| 4,397,022 | 8/1983 | Weng et al. |
| 4,679,082 | 7/1987 | Shibasaki |
| 4,723,243 | 2/1988 | Joshi et al. |
| 4,763,330 | 8/1988 | Shimizu |
| 4,833,678 | 5/1989 | Cohen |
| 4,845,713 | 7/1989 | Zook ..................... 371/37 |
| 4,873,688 | 10/1989 | Maki et al. |
| 4,914,660 | 4/1990 | Hirose |
| 4,945,537 | 7/1990 | Harada |
| 4,958,348 | 9/1990 | Berlekamp et al. ........... 371/37.1 |
| 5,020,060 | 5/1991 | Murai et al. |
| 5,040,179 | 8/1991 | Chen ..................... 371/37.1 |

*Primary Examiner*—Robert W. Beausoliel, Jr.
*Assistant Examiner*—Phung M. Chung
*Attorney, Agent, or Firm*—Andrus, Sceales, Starke & Sawall

[57] ABSTRACT

A decoder is utilized at the receiving end of a digital communication system for correcting symbol errors occurred in a received digital information which has been encoded into a group of Reed-Solomon codewords. The method used in the decoder follows a modified step-by-step decoding procedure. The decoder first calculates the syndromes of a received word. The syndromes form a first group of matrices whose determinant values are used for determining the weight of the error pattern of the received word. Subsequently, each of the symbols constituting the received word is altered to see how the corresponding weight of the error pattern of the altered word is changed thereby. If the weight is increased, the symbol being altered is a correct one; otherwise if decreased the symbol being altered is an erroneous one and thus correcting action is undertaken.

3 Claims, 22 Drawing Sheets

REAL-TIME REED-SOLOMON DECODER

CROSS-REFERENCES TO RELATED APPLICATIONS

This application is the continuation-in-part (CIP) of a previous application entitled "METHOD AND APPARATUS FOR DECODING CYCLIC CODES ON A STEP-BY-STEP BASIS" filed on Mar. 27, 1990 under the Ser. No. 07/499,664. This application is also related to the application entitled: "Real-Time Binary BCH Decoder".

BACKGROUND OF THE INVENTION

1. Field of the Invention

The present invention relates to a decoder which is to be utilized in the receiving end of a digital communication system for correcting symbol errors in a received digital message. In particular, the received digital message has been encoded into a group of Reed-Solomon (RS) codewords before being transmitted.

2. Description of Prior Art

In a digital data communication system which sends out digital informations through a channel to a receiver, due to noises and/or distortions, the received digital informations often contain a number of bit errors.

Referring to FIG. 1, there is shown the schematic diagram of a digital communication system which transmits digital informations in the form of words with symbols comprised of several bits. A message which is to be transmitted is first converted to a number of binary symbols, each of which has a bit length of m as shown in FIG. 2.

The digital communication system comprises a RS encoder 1 and a RS decoder 5. The symbols composing the digital information are processed by the RS encoder 1 in such a way that a number of check symbols are appended thereto to form a codeword with a block length of n. The codewords are then transmitted by a transmitter 2 via a channel 3 to a receiver 4. The RS decoder 5 is coupled to the receiver 4 and which is employed for detecting if there are symbol errors occurred in each received word and performing necessary correcting actions to the erroneous symbols.

A t-error-correcting RS codeword is often described by way of the following parameters and notations, wherein:

n denotes the block length, i.e. the number of symbols constituting one codeword;

k denotes the number the information symbols in one codeword;

m denotes the number of bits representing each symbol of the codeword;

t denotes the maximum number of symbol errors able to be corrected;

2t is the number of check symbols appended to the k information symbols, $k+2t=n$;

$d_{min}$ denotes the minimum distance, $d_{min}=2t+1$;

C(x) denotes the polynomial of the codeword;

R(x) denotes the polynomial of a received word corresponding to C(x); and

E(x) denotes the polynomial of an error pattern introduced into R(x), where $R(x)=C(x)+E(x)$.

The Reed-Solomon codes belong to a special subclass of non-binary BCH codes and thus the RS coding technique is suitable for application in the error correction of non-binary alphabets. With the RS coding technique, the transmission of digital information containing a stream of bits is implemented by treating a group of consecutive m bits as a symbol and n symbols as an information word.

Conventionally, a transform method is employed in a RS decoder for decoding RS codes. The transform method comprises four major steps of:

(a) calculating the syndrome values of a received word;

(b) calculating the error location polynomial the syndrome values by using Euclid's algorithm;

(c) determining the transform of the error polynomial;

(d) inverting the transform to obtain the error polynomial.

Another method, known as a standard algebraic method is also utilized in a RS decoder, which comprises the following steps of:

(a) calculating the syndrome values of a received word;

(b) determining the error location polynomial from the syndrome values;

(c) finding the roots of the location polynomial, which are used as the error locators for indicating positions where symbol errors occurred;

(d) determining the error values to be used for correcting the symbol errors in accordance with the error locators.

A step-by-step decoding method which has been proposed by Massey is still another method. The basic principle of the step-by-step decoding method for non-binary t-error-correcting BCH codes RS can be summarized as follows:

(a) determining the syndrome values of a received word;

(b) utilizing an iteration method for changing the syndrome values so as to make the weight, i.e. the number of erroneous symbols, of the error pattern exactly equal to t;

(c) adding in sequential order all the q−1 non-zero elements in GF(q) to the n symbol constituting the received word with testing to determine whether the weight of the error pattern has been reduced or increased. If the weight of error pattern is reduced to t−1, then both the error location and the corresponding error value are found.

(d) shifting R(x) one symbol cyclically to the right and repeat step (c).

The cyclical shifting of a received word R(x) is illustrated in FIG. 3. The difference between these two algebraic methods is that the step-by-step decoding method inspects every symbol of the received word and determines thereby if the symbol under inspection is erroneous or correct; while the standard algebraic decoding method searches for the roots of an error location polynomial at first to find where symbol errors have been occurred and thereafter uses the roots for evaluating the error values needed for correcting the symbol errors.

The conventional step-by-step decoding method has two drawbacks:

(1) the method needs an iteration loop to change the syndrome values of a received word to obtain an error pattern with a weight exactly equal to t.

(2) the method adds in a sequential order all the non-zero elements in $GF(2^m)$ to every symbols. That is, it requires $n(k-t)+Y_1+Y_2+ \ldots +Y_t$ iterations (approximately (n·k) for small t) for every received word.

SUMMARY OF THE INVENTION

In accordance with the present invention, the decoder first calculates the syndromes $S_i^{(0)}$, $i = 1,2, \ldots 2t$ of a received word $R(x)$. The syndromes $S_i^{(0)}$, $i = 1,2, \ldots 2t$ are used as the elements to form a plurality of matrices $\{N_1^{(0)}, N_2^{(0)}, \ldots, N_{t+1}^{(0)}\}$ whose determinant values are used to determine the weight of the error pattern of the received word $R(x)$.

Subsequently, the received word $R(x)$ is cyclically shifted to form a shifted word $R^{(j)}(x)$ and a predetermined symbol in $R^{(j)}(x)$ is changed to form an error-trial word $R^{(j)}(x)$. Since each symbol in the received word $R(x)$ is composed of m bits, there are in total $2^m - 1$ ways by which each symbol can be changed in value. Therefore, the error-trial word $R^{(j)}(x)$ is formed by adding each of the elements $\{\alpha^0, \alpha^1 \alpha^2 \ldots \alpha^{n-1}\}$ to the predetermined symbol. The syndromes $\{S_1^{(j)}, S_2^{(j)}, \ldots, S_t^{(j)}\}$ of the error-trial word $R^{(j)}(x)$ are then determined, which are also used as the elements to form a plurality of syndrome matrices $\{N_1^{(j)}, N_2^{(j)}, \ldots, N_{t+1}^{(j)}\}$ whose determinant values are used to determine the weight of the error pattern of the error-trial word $R^{(j)}(x)$.

The weight of the error pattern of the received word $R(x)$ and that of the error-trial word $R^{(j)}(x)$ are then compared. If the weight of the error-trial word $R^{(j)}(x)$ is larger by one than that of the received word $R(x)$, the predetermined symbol is a correct symbol if the weight of the error-trial word $R^{(j)}(x)$ is less by one than that of the received word $R(x)$, the predetermined symbol is an erroneous symbol and correcting action is performed thereto. If the weight of the error-trial word $R^{(j)}(x)$ is equal to that of the received word $R(x)$, the predetermined symbol is an erroneous symbol and the subsequent error-trial value is used until the weight of the error-trial word $R^{(j)}(x)$ is less by one than that of the received word $R(x)$.

BRIEF DESCRIPTION OF THE DRAWINGS

The present invention can be more fully understood by reading the subsequent detailed description of the preferred embodiments with references made to the accompanying figures, wherein.

DETAILED DESCRIPTION OF THE PREFERRED EMBODIMENTS

Figure 1:
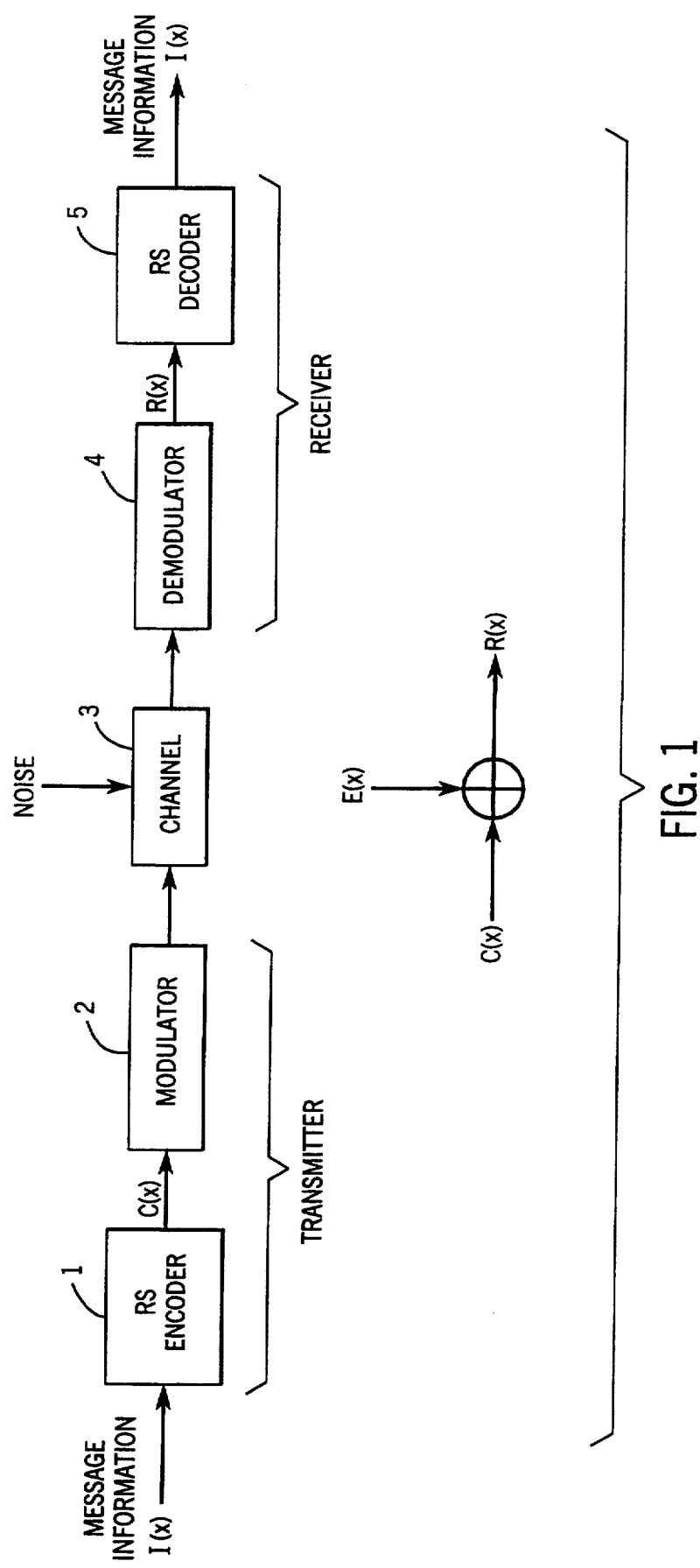
FIG. 1 shows a schematic diagram of a digital communication system which employs a RS encoder and a RS decoder.
Figure 2:
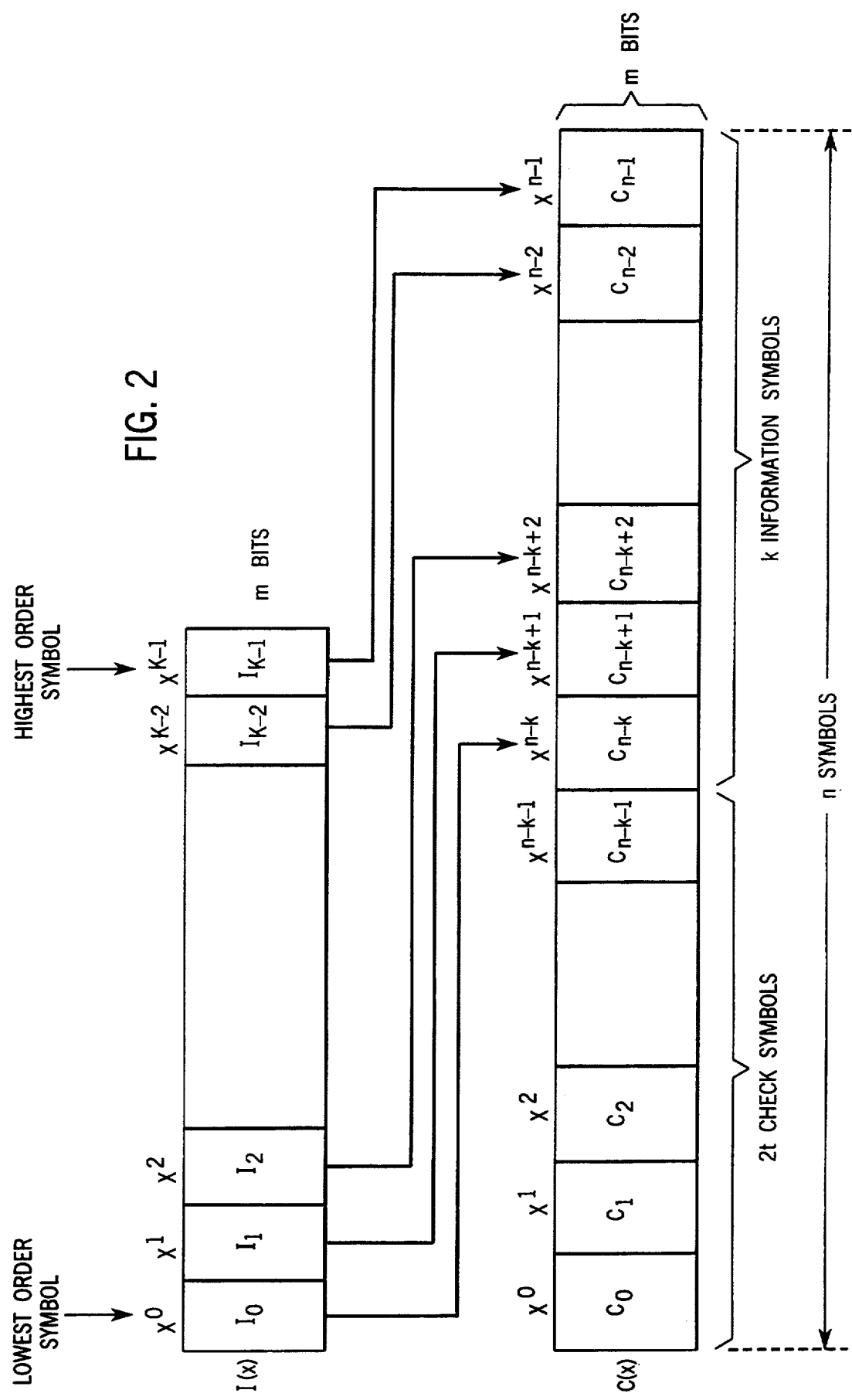
FIG. 2 shows the symbol patterns of the word of a message information and a RS codeword of the message information.
Figure 3:
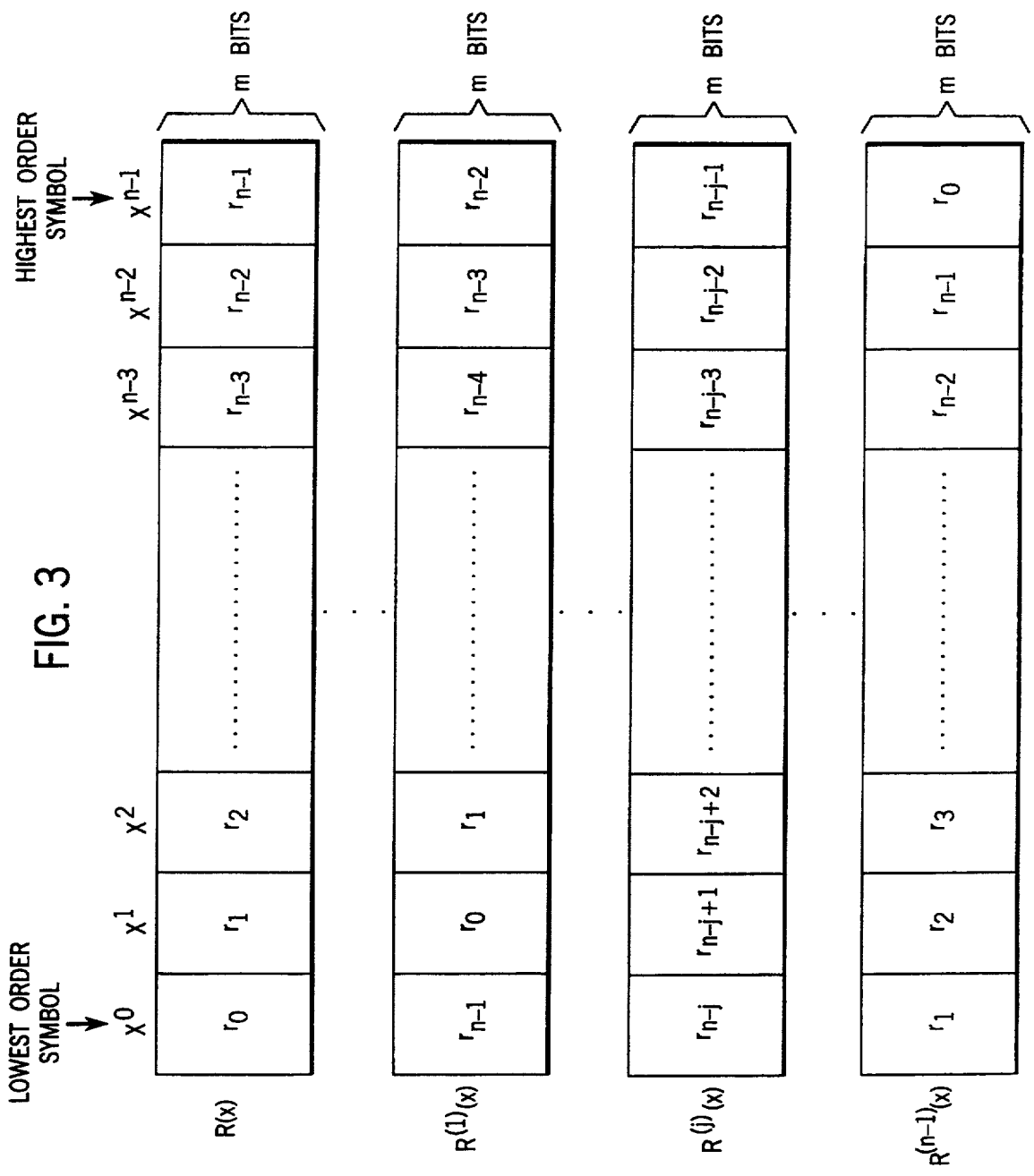
FIG. 3 shows how the symbols constituting a received word $R(x)$ are cyclically shifted to the right.

In the following descriptions, the symbols n, m, k, and t are used exclusively to represent constant values which will be defined later.

The operation of a t-error-correcting RS codeword comprised of n symbols which consists of m bits is defined by the operations in $GF(2^m)$. In the encoding process, a generating polynomial $g(x)$ is selected to transform an information polynomial $I(x)$, into a codeword $C(x)$. Let $M_i(x)$ be the minimal polynomial of $\alpha^i$, then $$M_i(x) = x + \alpha^i, \text{ for } i = 1,2 \ldots 2t \quad (2)$$

where $\alpha$ is a primitive element in $GF(2^m)$, then $$g(x) = M_1(x) \cdot M_2(x) \ldots M_{2t}(x) \quad (3)$$
$$= \prod_{i=1}^{2t} (x + \alpha^i)$$

and the codeword $C(x)$ is obtained by:

$$C(x) = I(x) \cdot x^{n-k} + \text{Mod } \{I(x) \cdot x^{n-k}/g(x)\} \quad (4)$$

where Mod $\{I(x) \cdot x^{n-k}/g(x)\}$ represents the remainder polynomial of $I(x) \cdot x^{n-k}$ divided by $g(x)$. A codeword thus obtained is said to be in a systematic form.

Let E(x) be the polynomial of the error pattern of a received word R(x), then $$R(x) = C(x) + E(x) \quad (5)$$
$$= r_{n-1} \cdot x^{n-1} + r_{n-2} \cdot x^{n-2} + \ldots +$$
$$r_2 \cdot x^2 + r_1 \cdot x^1 + r_0 \cdot x^0$$

where $r_p$, $p=0,1,2,\ldots n-1$ are elements in $GF(2^m)$.

The syndrome values of the received word R(x) are obtained by:

$$S_i^{(0)} = R(\alpha^i) = E(\alpha^i) \quad \text{for } i = 1, 2, \ldots, 2t \quad (6)$$

i.e.

$$S_i^{(0)} = \text{Mod}\left\{ \frac{R(x)}{x + \alpha^i} \right\} \quad \text{for } i = 1, 2, \ldots, 2t \quad (7)$$

which are values in $GF(2^m)$.

The Modified Step-by-Step Decoding Method

A modified step-by-step decoding technique utilized by the decoder in accordance with the present invention for the decoding of a RS encoded digital message is based on the principles of three theorems.

Theorem (1)

Assume the syndromes of a t-error-correcting RS code are $\{S_1^{(0)}, S_2^{(0)}, \ldots, S_{2t}^{(0)}\}$, then a syndrome matrix $N_p$, $1 \leq p \leq n$, represented by:

$$N_p^{(0)} = \begin{bmatrix} S_1^{(0)} & S_2^{(0)} & S_3^{(0)} & \ldots & S_p^{(0)} \\ S_2^{(0)} & S_3^{(0)} & S_4^{(0)} & \ldots & S_{p+1}^{(0)} \\ & & \vdots & & \\ S_p^{(0)} & S_{p+1}^{(0)} & S_{p+2}^{(0)} & \ldots & S_{2p-1}^{(0)} \end{bmatrix}, \text{ is}$$

singular if the number of symbol errors is equal to or less than $p-1$; and
non-singular if the number of symbol errors is exactly equal to p.

Based on the principle of Theorem (1), the weight of the error pattern of a received word can be determined from the values of $det(N_p^{(0)})$, $p=1,2,\ldots, t+1$, where $det(N_p^{(0)})$ represents the determinant of the syndrome matrix $N_p^{(0)}$.

For example, in a double-error-correcting RS code, i.e. $t=2$, the value of the determinants $det(N_1^{(0)})$, $det(N_2^{(0)})$ and $det(N_3^{(0)})$ with respect to the number of erroneous symbols in a received word are as follows:

(1) If there is no symbol error, then $$det(N_1^{(0)}) = 0,$$
$$det(N_2^{(0)}) = 0, \text{ and}$$
$$det(N_3^{(0)}) = 0.$$

(2) If there is one symbol error, then $$det(N_1^{(0)}) \neq 0,$$
$$det(N_2^{(0)}) = 0, \text{ and}$$
$$det(N_3^{(0)}) = 0.$$

(3) If there are two symbol errors, then $$det(N_1^{(0)}) = x,$$
$$det(N_2^{(0)}) \neq 0, \text{ and}$$
$$det(N_3^{(0)}) = 0,$$

where x is an arbitrary value which can be zero or non-zero and is of no concern to the determination of the weight of the error pattern.

(4) If there are three symbol errors, then $$det(N_1^{(0)}) = y,$$
$$det(N_2^{(0)}) = z, \text{ and}$$
$$det(N_3^{(0)}) \neq 0.$$

where y, z are arbitrary values which can be either zero or non-zero and are of no concern to the determination of the weight of the error pattern.

From the above deductions, it can be clearly seen that corresponding to each case with a different weight, there is a unique combination of the determinants. Accordingly, by determining the zeronesses of the determinants, the weight of the error pattern of a received word can be determined.

To put Theorem (1) in real-word practice, there exists, however, one particular problem which must be solved first. That is, from Theorem (1), it can be seen that in the case of $t=2$ the calculation of $det(N_3^{(0)})$, where $$N_3^{(0)} = \begin{bmatrix} S_1^{(0)} & S_2^{(0)} & S_3^{(0)} \\ S_2^{(0)} & S_3^{(0)} & S_4^{(0)} \\ S_3^{(0)} & S_4^{(0)} & S_5^{(0)} \end{bmatrix}$$

requires the determination of the five elements $\{S_1^{(0)}, S_2^{(0)}, S_3^{(0)}, S_4^{(0)}, S_5^{(0)}\}$. However, in hardware implementation of the decoding technique, it is usual that only the syndrome values $\{S_1^{(0)}, S_2^{(0)}, S_3^{(0)}, S_4^{(0)}\}$ are determined.

Therefore, a modified syndrome matrix $N'_{t+1}^{(0)}$ is used in substitution of the syndrome matrix $N_{t+1}^{(0)}$, which is defined by:

$$det(N'_{t+1}^{(0)}) = det(N_{t+1}^{(0)}) + S_{2t+1}^{(0)} \cdot det(N_f^{(0)})$$

where the matrix $N_f^{(0)}$ is the cofactor of the element $S_{2t+1}^{(0)}$ in the matrix $N_{t+1}^{(0)}$. It is clear from the relationship that the value of $det(N_{t+1})$ is now dependent only on the elements $S_j^{(0)}$, $j=1,2,\ldots 2t$ and independent on the element $S_{2t+1}^{(0)}$. The modified syndrome matrix $det(N'_{t+1}^{(0)})$ can be proofed to satisfy the following theorem.

Theorem (2)

For a t-error-correcting RS codeword, if the number of erroneous symbols occurring in the received word is equal to or less than $t-1$, then $$det(N'_{t+1}^{(0)}) = 0; \text{ and}$$

if the number of erroneous symbols is $t+1$ and $det(N_f^{(0)}) = 0$, then $det(N'_{t+1}{}^{(0)}) \ne 0$.

In the former case, it can be inferred in accordance with Theorem (1) that $det(N_{t+1}{}^{(0)}) = det(N_t{}^{(0)}) = 0$, and therefore:

$$\begin{aligned} det(N'{}^{(0)}_{t+1}) &= det(N^{(0)}_{t+1}) + S^{(0)}_{2t+1} \cdot det(N^{(0)}_t) \\ &= 0 + 0 \\ &= 0. \end{aligned}$$

And in the latter case, $det(N_{t+1}) \ne 0$ and $det(N_t) = 0$, and therefore:

$$\begin{aligned} det(N'{}^{(0)}_{t+1}) &= det(N^{(0)}_{t+1}) + S^{(0)}_{2t+1} \cdot det(N^{(0)}_t) \\ &= det(N^{(0)}_{t+1}) \\ &\ne 0. \end{aligned}$$

For example, in a double-error-correcting RS code, i.e. $t=2$, the value of the determinants $det(N_1{}^{(0)})$, $det(N_2{}^{(0)})$ and $det(N_3{}^{(0)})$ with respect to the number of erroneous symbols in a received word are as follows:

(1) If there is no symbol error, then $det(N_1^{(0)}) = 0$, $det(N_2^{(0)}) = 0$, and $det(N'_3{}^{(0)}) = 0.$ (2) If there is one symbol error, then $det(N_1^{(0)}) \ne 0$, $det(N_2^{(0)}) = 0$, and $det(N'_3{}^{(0)}) = 0.$ (3) If there are two symbol errors, then $det(N_1^{(0)}) = x_1$, $det(N_2^{(0)}) \ne 0$, and $det(N'_3{}^{(0)}) = x_2$, where $x_1, x_2$ are arbitrary values which can be zero or non-zero and are of no concern to the determination of the weight of the error pattern.

(4) If there are three symbol errors, then $det(N_1^{(0)}) = y_1$, $det(N_2^{(0)}) \ne 0$, and $det(N'_3{}^{(0)}) = y_2$;

or $det(N_1^{(0)}) = z_1$, $det(N_2^{(0)}) \ne 0$, and $det(N'_3{}^{(0)}) = z_2$;

where $y_1, y_2, z_1, z_2$ are arbitrary values which can be either zero or non-zero and are of no concern to the determination of the weight of the error pattern.

And in the example of a triple-error-correcting RS code, i.e. $t=3$, the value of the determinants $det(N_1{}^{(0)})$, $det(N_2{}^{(0)})$, $det(N_3{}^{(0)})$, and $det(N_4{}^{(0)})$ with respect to the number of erroneous symbols in a received word are as follows:

(1) if there is no symbol error, then $det(N_1^{(0)}) = 0$, $det(N_2^{(0)}) = 0$, $det(N_3^{(0)}) = 0$, and $det(N'_4{}^{(0)}) = 0;$ (2) if there is one symbol error, then $det(N_1^{(0)}) \ne 0$, $det(N_2^{(0)}) = 0$, $det(N_3^{(0)}) = 0$, and $det(N'_4{}^{(0)}) = 0;$ (3) if there are two symbol errors, then $det(N_1^{(0)}) = x_1$, $det(N_2^{(0)}) \ne 0$, $det(N_3^{(0)}) = 0$, and $det(N'_4{}^{(0)}) = 0;$ (4) if there are three symbol errors, then $det(N_1^{(0)}) = y_1$, $det(N_2^{(0)}) = y_2$, $det(N_3^{(0)}) \ne 0$, and $det(N'_4{}^{(0)}) = y_3;$ (5) if there are four symbol errors, then $det(N_1^{(0)}) = z_1$, $det(N_2^{(0)}) = z_2$, $det(N_3^{(0)}) \ne 0$, and $det(N'_4{}^{(0)}) = z_3;$ or $det(N_1^{(0)}) = v_1$, $det(N_2^{(0)}) = v_2$, $det(N_3^{(0)}) = 0$, and $det(N'_4{}^{(0)}) \ne 0;$ where $x_1, y_1, y_2, y_3, z_1, z_2, z_3, v_1, v_2$ are arbitrary values which can be either zero or non-zero and are of no concern to the determination of the weight of the error pattern.

$h_p{}^{(0)} = 1$ if $det(N_p{}^{(0)}) = 0$, and $h_p{}^{(0)} = 0$ if $det(N_p{}^{(0)}) \ne 0$ for $p = 1, 2 \ldots t$; and $h_{t+1}{}^{(0)} = 1$ *if* $det(N'_{t+1}{}^{(0)}) = 0$, and $h_{t+1}{}^{(0)} = 0$ *if* $det(N'_{t+1}{}^{(0)}) \ne 0$.

A decision vector $H^{(0)}$ with $t+1$ tuples defined by:

$$H^{(0)} = [h_1^{(0)}, h_2^{(0)}, \ldots, h_{t+1}^{(0)}]$$

can be used to represent a set of the decision bits.

Before describing the deductions, a couple of denotations will be introduced first. In the subsequent descriptions, $\phi_p$ is used to represent a set of all the possible decision vectors corresponding to an error pattern with a weight of p. And in a decision vector, the expression "$1^q$" is used to represent q consecutive tuples with the same value of 1. Accordingly, for the general case of a t-error-correcting RS code, the weight of the error pattern can be determined with the following deductions:

(1) If there is no symbol error, then
$$H^{(0)} \in \phi_0 = \{[1^{t+1}]\},$$

(2) If the is one symbol error, then
$$H^{(0)} \in \phi_1 = \{[0,1^t]\}$$

(3) If there are p symbol errors, where $2 \leq p < t$, then
$$H^{(0)} \in \phi_p = \{[x^{p-1}, 0, 1^{t-p+1}]\},$$

(4) If there are t symbol errors, then
$$H^{(0)} \in \phi_t = \{[x^{t-1}, 0, x]\}.$$

(5) If there are t + 1 symbol errors then,
$$H^{(0)} \in \phi_{t+1} = \{[x^{t-1}, 0, x], [x^{t-1}, 1, 0]\}$$

where the symbol "x" represents a bit with a don't-care value.

From the above relationships, it can be seen that in a different case with a different number of symbol errors, there is a unique combination of the decision bits in the corresponding decision vectors. As a result, the sets $\phi_0$, $\phi_1$, $\phi_2$, ... and $\phi_t$ are distinguishable from one another.

One important aspect of the decoding method for RS codes is that all of the symbol errors in a received word R(x) can be corrected only under the condition that the gross number thereof is equal to or less than t. If the gross number of the symbol errors is t+1 or greater, the received word can not be correctly decoded and thus should this be the situation the receiver may have to request the sender to send the corresponding codeword again.

The basic principle of the step-by-step decoding method according to Massey is that the value of each of the symbols constituting a received word R(x) is changed to form a new word; and then a test is conducted to see if the weight of the error pattern of the new word is reduced or increased. This process is termed as an error trial process.

For an erroneous symbol, the difference between the value represented thereby and the value represented by its correct one is termed a symbol error value of the erroneous symbol. In accordance with the modified step-by-step decoding method, at each error trial process, the symbol undergoing decoding is changed by adding a value $\beta \in GF(2^m)$, termed an error trial value, thereto to form a new word and a test is conducted to see if the weight corresponding to the new word is increased or decreased.

If there are p symbol errors in the received word and if a symbol before being changed is a correct symbol, then changing the value of the symbol will increase the weight of the error pattern of the new word to p+1; otherwise if a symbol before being changed is an erroneous symbol, then changing the value of the symbol exactly with its symbol error value, the weight of the error pattern of the new word will be decreased by one to p−1. If the weight of the error pattern is still p after an error trial value is used, then the symbol is an erroneous symbol but the error trial value is not the symbol error value and under this condition another error-trial value will be used until the weight of the error pattern becomes p−1.

Since each symbol in the received word R(x) is represented by m bits, there are in total $2^m - 1$ ways by which the value of the symbol can be changed. Therefore, if a symbol is an erroneous one, there are $2^m - 1$, or n, possible values ranging from $\alpha^0$ to $\alpha^{n-1}$, which may be the symbol error value of the erroneous symbol. To find out which one is the right symbol error value, a trial and error process will be utilized.

At each step of the error trial process, the error trial value $\beta$ is selected from the group comprising all the elements in the $GF(2^m)$, i.e. $\beta = \alpha^i$, for $i = 0,1,2, \ldots, n-1$. If one error trial value is determined to be not the symbol error value, the next error trial value will be tried until one error trial value is found out to be the symbol error value.

Since the RS codes are a subclass of cyclic codes, in a received word R(x) with correctable error patterns, if the first erroneous symbol of R(x) can be decoded correctly, then the entire word can be decoded correctly.

In accordance with the present invention, a received word R(x) is shifted cyclically to form a shifted word $R^{(j)}(x)$ and the error trial process is performed to the lowest order symbol $r_{n-j}$ of the shifted word $R^{(j)}(x)$. After the symbol $r_{n-j}$ has been decoded, the shifted word $R^{(j)}(x)$ is shifted cyclically again and the foregoing process is performed once again. This procedure repeats until all the symbols of the received word R(x) have been decoded once.

If the syndrome values of a shifted word $R^{(j)}(x)$ formed by shifting each of the bits constituting R(x) j places cyclically to the right is $\{S_1^{(j)}, S_2^{(j)}, \ldots, S_i^{(j)}\}$, then the syndrome values of an error-trial word $\bar{R}^{(j)}(x)$ defined by adding an error-trial value $\beta$ to the highest order symbol $r_{n-j}$ of the shifted word $R^{(j)}(x)$, i.e.

$$\bar{R}^{(j)}(x) = R^{(j)}(x) + \beta,$$

can be determined by the following relationship:

$$\bar{S}_i^{(j)} = S_i^{(j)} + \beta: i = 1,2,\ldots,2t \qquad (10)$$

Accordingly, the weight of the error-trial word $\bar{R}^{(j)}(x)$ can also be determined by applying the principle of Theorem (1). A syndrome matrices corresponding to the syndromes $S_i^{(j)}$, $i = 1,2,\ldots 2t$ is expressed by:

$$N_p^{(j)} = \begin{bmatrix} S_1^{(j)} & S_2^{(j)} & S_3^{(j)} & \ldots & S_p^{(j)} \\ S_2^{(j)} & S_3^{(j)} & S_4^{(j)} & \ldots & S_{p+1}^{(j)} \\ \cdot & & & & \\ \cdot & & & & \\ S_p^{(j)} & S_{p+1}^{(j)} & S_{p+2}^{(j)} & \ldots & S_{2p-1}^{(j)} \end{bmatrix}$$

for $p = 1, 2, \ldots, t + 1$.

All the same as before, but considering whether the values of the determinants $\det(N_p^{(j)})$, $p = 1,2,\ldots,t$ and $\det(N'_{t+1}^{(j)})$ are zero or non-zero where $\det(N'_{t+1}^{(j)}) = \det(N_{t+1}^{(j)}) + S_{2t+1} \cdot \det(N_t^{(j)})$. Therefore, another set of decision bits $\{h_1^{(j)}, h_2^{(j)}, \ldots, h_{t+1}^{(j)}\}$ can be defined by:

$$h_p^{(j)} = 1 \text{ if } det(N_p^{(j)}) = 0 \quad (11a)$$

$$h_p^{(j)} = 0 \text{ if } det(N_p^{(j)}) \neq 0$$

for $p = 1, 2, \ldots, t$ and $$h_{t+1}^{(j)} = 1 \text{ if } det(N'^{(j)}_{t+1}) = 0 \quad (11b)$$

$$h_{t+1}^{(j)} = 0 \text{ if } det(N'^{(j)}_{t+1}) \neq 0$$

And these decision-bits are collectively represented by a decision vector $H^{(j)}$, where $$H^{(j)} = [h_1^{(j)}, h_2^{(j)}, \ldots, h_{t+1}^{(j)}] \, j = 1, 2, \ldots, n-1$$

Theorem (3)

For a t-error-correcting RS code, if all the sets $\phi_j$, $j = 1, 2, \ldots, t$ can be distinguished from one another and $\phi_{t+1}$ can be distinguished from $\phi_p$, $0 \leq p \leq t-1$, then any error pattern thereof whose weight is equal to or less than t can be corrected.

The proof to the Theorem (3) can be conducted by using an induction method to the following cases.

(Case 1: Weight=1):

In this case, $H^{(0)} \in \phi_1$. If each of the n symbols constituting the received word is temporarily changed one by one by adding all n possible error trial values $\alpha^0, \alpha^1, \alpha^2, \ldots \alpha^{n-1}$ thereto and supposing that $r_{n-p}$ is an erroneous symbol with a symbol error value of $\beta$, then adding $\beta$ to $r_{n-p}$ will reduce the weight of the error pattern, i.e. causing $H^{(p)} \in \phi_0$.

If a possible error trial value, for example $\alpha^q$, is not the symbol error value of the erroneous symbol $r_{n-p}$, then the erroneous symbol $r_{n-p}$ after adding $\alpha^q$ is still an erroneous symbol and therefore $H^{(p)} \in \phi_1$.

Suppose $r_{n-p}$ is a correct symbol, then changing $r_{n-p}$ no matter with which error trial value will increase the weight of the error pattern to two, i.e. causing $H^{(p)} \in \phi_2$.

Since $\phi_0$, $\phi_1$, and $\phi_2$ can be distinguished from one another, the symbol error value of an erroneous symbol can be decided and thus the error pattern thereof can be corrected.

(Case 2: Weight=2):

In this case, $H^{(0)} \in \phi_2$. If each of the n symbols constituting the received word is temporarily changed one by one by adding all n possible error trial values $\alpha^0, \alpha^1, \alpha^2, \ldots, \alpha^{n-1}$ thereto and supposing that $r_{n-p}$ is an erroneous symbol with an symbol error value of $\beta$, then adding $\beta$ to $r_{n-p}$ will reduce the weight of the error pattern, i.e. causing $H^{(p)} \in \phi_1$.

If a possible error trial value, for example $\alpha^q$, is not the symbol error value of the erroneous symbol $r_{n-p}$, then the erroneous symbol $r_{n-p}$ after adding $\alpha^q$ is still an erroneous symbol and therefore $H^{(p)} \in \phi_2$.

Suppose $r_{n-p}$ is a correct symbol, then changing $r_{n-p}$ no matter with which error trial value will increase the weight of the error pattern to three, i.e. causing $H^{(p)} \in \phi_3$.

Since $\phi_1$, $\phi_2$, and $\phi_3$ can be distinguished from one another, the symbol error value of an erroneous symbol can be decided and thus the erroneous symbol can be corrected. After the first erroneous symbol has been corrected, this case is reduced to Case 1.

(Case 3: Weight=v, $3 \leq v \leq t-1$):

In this case, $H^{(0)} \in \phi_v$. If each of the n symbols constituting the received word is temporarily changed one by one by adding all n possible error trial values $\alpha^0, \alpha^1, \alpha^2, \ldots, \alpha^{n-1}$ thereto and supposing that $r_{n-p}$ is an erroneous symbol with an symbol error value of $\beta$, then adding $\beta$ to $r_{n-p}$ will reduce the weight of the error pattern, i.e. causing $H^{(p)} \in \phi_{v-1}$.

If a possible error trial value, for example $\alpha^q$, is not the symbol error value of the erroneous symbol $r_{n-p}$, then the erroneous symbol $r_{n-p}$ after adding $\alpha^q$ is still an erroneous symbol and therefore $H^{(p)} \in \phi_v$.

Suppose $r_{n-p}$ is a correct symbol, then changing $r_{n-p}$ no matter with which error trial value will increase the weight of the error pattern to three, i.e. causing $H^{(p)} \in \phi_{v+1}$.

Since $\phi_{v-1}$, $\phi_v$, and $\phi_{v+1}$ can be distinguished from one another, the symbol error value of an erroneous symbol can be decided and thus the erroneous symbol can be corrected. After the first erroneous symbol has been corrected, this case is reduced to a case with weight = v − 1.

(Case 4: Weight=t):

In this case, $H^{(0)} \in \phi_t$. If each of the n symbols constituting the received word is temporarily changed one by one by adding all n possible error trial values $\alpha^0, \alpha^1, \alpha^2, \ldots, \alpha^{n-1}$ thereto and supposing that $r_{n-p}$ is an erroneous symbol with an symbol error value of $\beta$, then adding $\beta$ to $r_{n-p}$ will reduce the weight of the error pattern, i.e. causing $H^{(j)} \in \phi_{t-1}$.

If a possible error trial value, for example $\alpha^q$, is not the symbol error value of the erroneous symbol $r_{n-p}$, then the erroneous symbol $r_{n-p}$ after adding $\alpha^q$ is still an erroneous symbol and therefore $H^{(p)} \in \phi_t$.

Supposing $r_{n-p}$ is a correct symbol, then changing $r_{n-p}$ no matter with which error trial value will increase the weight of the error pattern to three, i.e. causing $H^{(p)} \in \phi_{t+1}$.

Since $\phi_t$ and $\phi_{t+1}$ can be distinguished from $\phi_{t-1}$, the symbol error value of an erroneous symbol can be decided and thus the erroneous symbol can be corrected. After the first erroneous symbol has been corrected, this case is reduced to a case with weight = t − 1. Using the principle of induction, an error pattern with a weight from 1 to t can be corrected.

If a symbol undergoing decoding is a correct symbol, it seems that unless all the error-trial values have been tried once the symbol cannot be determined to be a correct one so that the error-checking process for the correct symbol requires n clock cycles to accomplish. However, with the following two corollaries, this conception is not always true and time may even be reduced to only one clock cycle to complete the error-checking process.

Corollary (1)

If the weight of the error pattern of a received word R(x) is equal to or less than t − 1, i.e $H^{(0)} \in \phi_p$, where $p \leq t - 1$, then in the decoding of a symbol $r_{n-s}$ of the received word R(x), if after the adding of the first error trial value to the symbol $r_{n-s}$, the weight of the error pattern increases, i.e. $H^{(s)} \in \phi_{p+1}$, then the symbol $r_{n-s}$ can be determined immediately to be a correct symbol without the need of trying the rest of the error trial values.

Corollary (2)

If the weight of the error pattern of a received word R(x) is exactly equal to t, i.e. $H^{(0)} \in \phi_t$, then in the decoding of a symbol $r_{n-s}$ of the received word R(x), where $0 \leq s \leq n-1$, if after the adding of a certain error trial value to the symbol $r_{n-s}$, the decision vector corresponding to the error pattern is found to be $H^{(s)} \epsilon \{(x^{t-1}, 1, 0)\}$, then the symbol $r_{n-s}$ can be immediately determined to be a correct symbol without the need of trying the rest of the error trial values.

In accordance with the foregoing Corollary (1), it can be inferred that in a condition under that case only one error-trial step is needed in the error-checking process of a symbol to determine that the symbol is a correct symbol.

In the case described in the Corollary (2), however, since there are two possible combinations for a decision vector of $\phi_{t+1}$, namely $[x^{t-1}, 0, x]$ and $[x^{t-1}, 1, 0]$, the decoding of a correct symbol has to be carried on until the condition $H^{(j)} = [x^{t-1}, 1, 0]$ is met or until all the error-trial values have been used so the correct symbol can be eventually determined to be a correct one. As a result, the error-trial process may require less than n clock cycles if the decision vector in one error-trial step is found to be $H^{(j)} = [x^{t-1}, 1, 0]$; or require exactly n clock cycles if the decision vector in each error-trial step is always $H^{(j)} = [x^{t-1}, 0, x]$.

If the weight of the error pattern of a received word $R(x)$ is t, as the case described in Corollary (2), then after the first erroneous symbol, say $r_{n-p}$ with a symbol error value $\beta$, has been found and corrected, the weight of the error pattern is reduced to $t-1$, i.e. reduced to the case described in Corollary (1). Since in the case of Corollary (1), the error-checking process of a correct symbol requires only one single error-trial step, the decision vector $H^{(p)}$ corresponding to the received word $R(x)$ with the erroneous symbol $r_{n-p}$ being corrected, i.e. a word $R'(x) = R(x) + \beta \cdot x^{n-p}$, can be used to replace the decision vector $H^{(0)}$ of the received word $R(x)$. In this way, the error-checking process for the subsequent correct symbols in $R(x)$ may apply the principle of Corollary (1) and whereby the processing speed is significantly increased.

Figure 4:
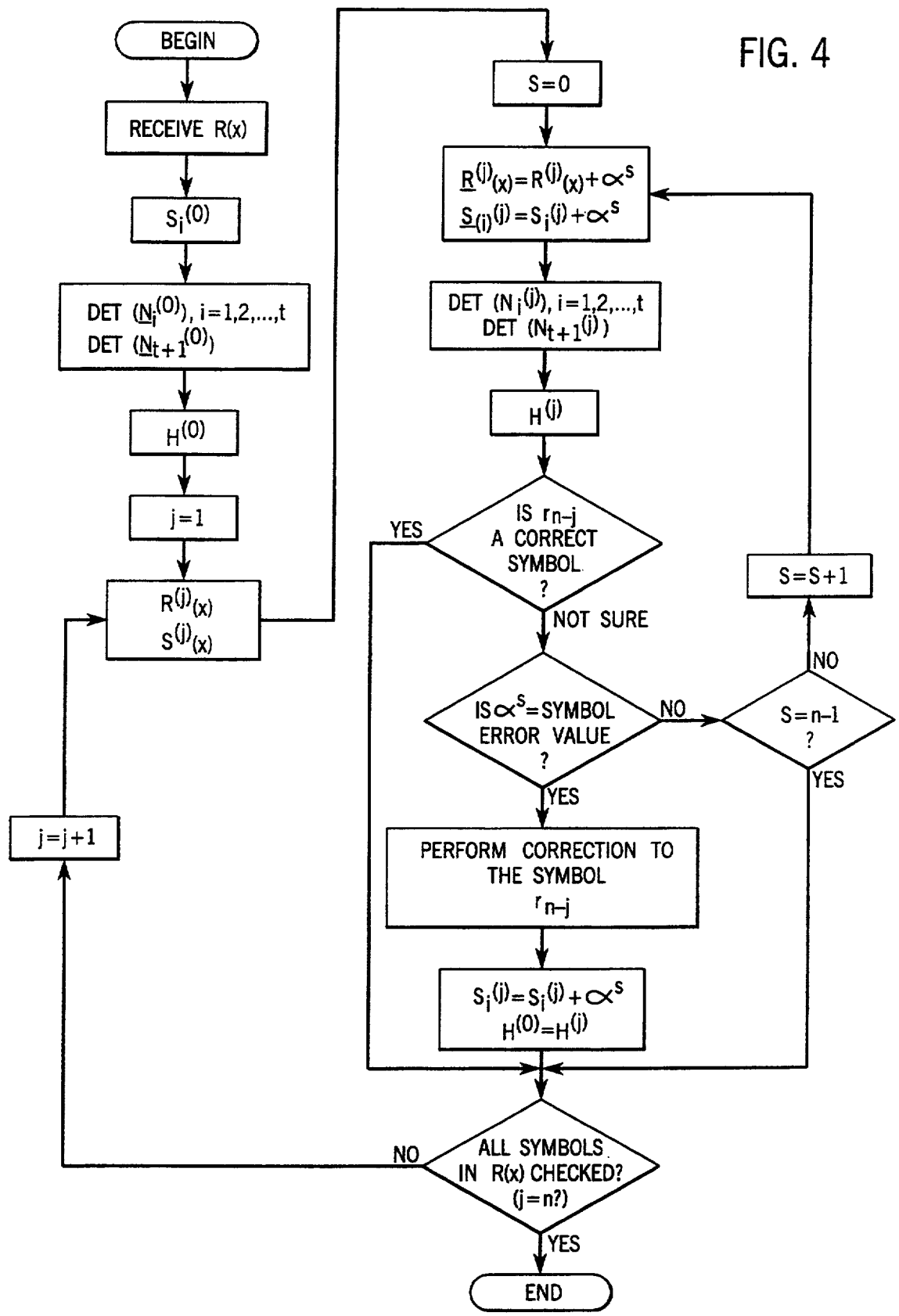
FIG. 4 is a flow chart, showing the procedural steps of the decoding method in accordance with the present invention.

As a conclusion, the procedural steps of the modified step-by-step decoding technique utilized by the decoder according to the present invention for decoding a received word $R(x)$ is summarized and shown in the flow diagram of FIG. 4, which includes:

STEP (0):

receiving a word $R(x)$;

STEP (1):

determining the syndromes $\{S_1^{(0)}, S_2^{(0)}, \ldots S_{2t}^{(0)}\}$ of the received word $R(x)$;

STEP (2):

determining $det(N_p^{(0)})$ for $p = 1, 2, \ldots, t$, where $$N_p^{(0)} = \begin{bmatrix} S_1^{(0)} & S_2^{(0)} & S_3^{(0)} & \cdots & S_p^{(0)} \\ S_2^{(0)} & S_3^{(0)} & S_4^{(0)} & \cdots & S_{p+1}^{(0)} \\ & & \vdots & & \\ S_p^{(0)} & S_{p+1}^{(0)} & S_{p+2}^{(0)} & \cdots & S_{2p-1}^{(0)} \end{bmatrix}$$

and determining $det(N'_{t+1}^{(0)})$, where $det(N'_{t+1}^{(0)}) = det(N_{t+1}^{(0)}) + S_{2t+1} \cdot det(N_t^{(0)})$;

STEP (3):

determining $H^{(0)} = [h_1^{(0)}, h_2^{(0)}, \ldots h_{t+1}^{(0)}]$

-continued where $h_p^{(0)} = 1$ if $det(N_p^{(0)}) = 0$, and
$h_p^{(0)} = 0$ if $det(N_p^{(0)}) \neq 0$ for $p = 1, 2, \ldots, t$, and $h_{t+1}^{(0)} = 1$ if $det(N'_{t+1}^{(0)}) = 0$, and
$h_{t+1}^{(0)} = 0$ if $det(N'_{t+1}^{(0)}) \neq 0$

STEP (4):

Assigning $j = 1$;

STEP (5):

determining the syndromes $\{S_1^{(j)}, S_2^{(j)}, \ldots, S_{2t}^{(j)}\}$ of a shifted word $R^{(j)}(x)$, where $R^{(j)}(x)$ is formed by cyclically shifting the symbols constituting the received $R(x)$ one place to the right;

STEP (6):

assigning $s = 0$;

STEP (7):

determining the syndromes $\{\underline{S}_1^{(j)}, \underline{S}_2^{(j)}, \ldots, \underline{S}_{2t}^{(j)}\}$ of an error-trial word $\underline{R}^{(j)}(x)$, where $\underline{R}^{(j)}(x)$ is formed by performing $\underline{R}^{(j)}(x) = R^{(j)}(x) + a^s$;

{COMMENT : adding an error-trial value $a^s$ to the lowest-order symbol of the shifted word $R^{(j)}(x)$ to form an error-trial word $\underline{R}^{(j)}(x)$, the step of performing $\underline{R}^{(j)}(x) = R^{(j)}(x) + a^s$ is not actually executed in practical implementation.}

STEP (8):

determining $det(\underline{N}_p^{(j)})$ for $p = 1, 2, \ldots, t$, where $$\underline{N}_p^{(j)} = \begin{bmatrix} \underline{S}_1^{(j)} & \underline{S}_2^{(j)} & \underline{S}_3^{(j)} & \cdots & \underline{S}_p^{(j)} \\ \underline{S}_2^{(j)} & \underline{S}_3^{(j)} & \underline{S}_4^{(j)} & \cdots & \underline{S}_{p+1}^{(j)} \\ & & \vdots & & \\ \underline{S}_p^{(j)} & \underline{S}_{p+1}^{(j)} & \underline{S}_{p+2}^{(j)} & \cdots & \underline{S}_{2p-1}^{(j)} \end{bmatrix}$$

and determining $det(\underline{N}'_{t+1}^{(j)})$, where $det(\underline{N}'_{t+1}^{(j)}) = det(\underline{N}_{t+1}^{(j)}) + \underline{S}_{2t+1} \cdot det(\underline{N}_t^{(j)})$;

STEP (9):

determining $H^{(j)} = [h_1^{(j)}, h_2^{(j)}, \ldots, h_{t+1}^{(j)}]$ where $h_p^{(j)} = 1$ if $det(\underline{N}_p^{(j)}) = 0$, and
$h_p^{(j)} = 0$ if $det(\underline{N}_p^{(j)}) \neq 0$ for $p = 1, 2, \ldots, t$, and $h_{t+1}^{(j)} = 1$ if $det(\underline{N}'_{t+1}^{(j)}) = 0$, and
$h_{t+1}^{(j)} = 0$ if $det(\underline{N}'_{t+1}^{(j)}) \neq 0$

STEP (10A):

if $H^{(0)} \epsilon \phi_p$ and
$H^{(j)} \epsilon \phi_{p+1}$
where $0 \leq p \leq t-1$
then jumping to STEP (14);
{COMMENT: the symbol $r_{n-j}$ is a correct symbol.}
if $H^{(0)} \epsilon \phi_t$ and
$H^{(j)} = [x^{t-1}, 1, 0] \epsilon \phi_{t+1}$
then
jumping to STEP (14);
{COMMENT: the symbol $r_{n-j}$ is a correct symbol.}

STEP (10B):

if $H^{(0)} \epsilon \phi_p$ and
$H^{(j)} \epsilon \phi_{p-1}$
where $0 \leq p \leq t$,

15
-continued then
  jumping to STEP (11)
else jumping to STEP (13);
{COMMENT: the symbol $r_{n-j}$ is an erroneous symbol.}

STEP (11):

performing $r_{n-j} = r_{n-j} + \alpha^s$
{COMMENT: correcting the symbol $r_{n-j}$ with the error-trial value.}

STEP (12):

performing $S_i^{(j)} = S_i^{(j)} + \alpha^s$ for $i = 1, 2, \ldots, 2t$
  substituting $H^{(0)}$ with $H^{(p)}$;
{COMMENT: reducing the case of Corollary (2) to the case of Corollary (1), for the sake of simplifying the design in hardware implementation, this step is performed regardless if $H^{(0)} \in \phi_t$ or not.

STEP (13):

determining if $s = n$ ?
  if NOT
    assigning $s = s + 1$ and
    jumping to STEP (7)
{COMMENT: check if all the error-trial values have been used, if YES the decoding of the symbol $r_{n-j}$ is completed and the symbol $r_{n-j}$ is determined to be a correct symbol.}

STEP (14):

determining if $j = n$ ?
  if NOT
    assigning $j = j + 1$ and
    jumping to STEP (5);
  if YES
    ending the decoding process.
{COMMENT: check if all the symbols in the received word $R(x)$ have been decoded, if yes the decoding of $R(x)$ is completed.}.

The above-described modified step-by-step decoding technique utilized by the decoder in accordance with the present invention can be easily implemented by software for the calculation of the many mathematical equations involved in the procedural steps thereof and for the correcting actions. However, in a high speed digital data communication system where high-speed decoding is required, an implementation of the decoding by software is often too slow to be practical. Therefore, the concentration will be focus solely on how to configure a hardware decoder which is capable of performing the method of the present invention.

First Preferred Embodiment of a Hardware RS decoder

Figure 5:
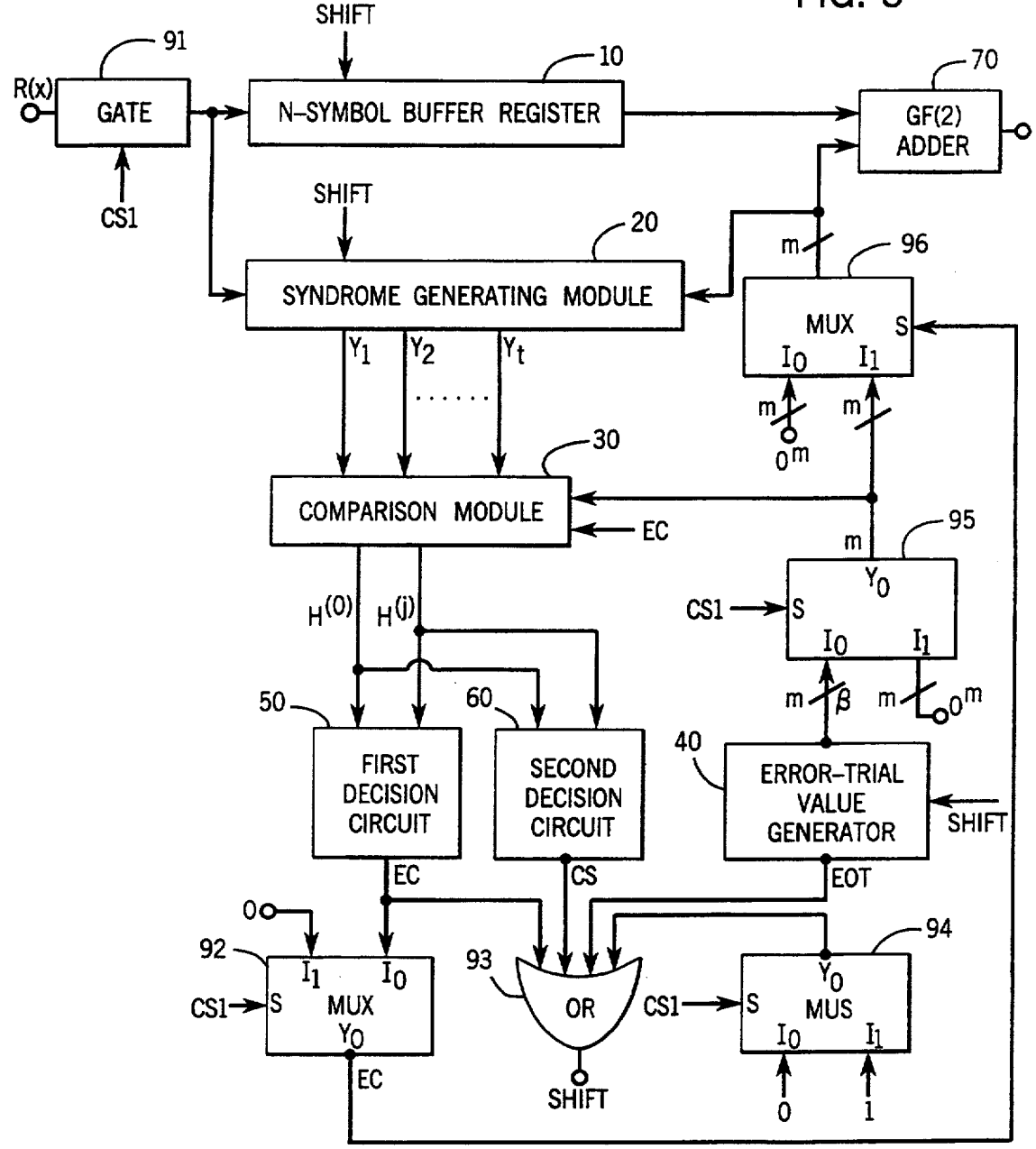
FIG. 5 shows the block diagram of a RS decoder for performing the decoding method of the present invention.

Referring to FIG. 5, there is shown the block diagram of a RS decoder 5 configured for performing the modified step-by-step decoding method of the present invention. The essential elements of the sequential RS decoder 5 comprise a delay register 10, a syndrome generator 20, a comparison circuit 30, an error-trial value generator 40, a first decision circuit 50, a second decision circuit 60, and a $GF(2^m)$ adder 70.

Figure 6:
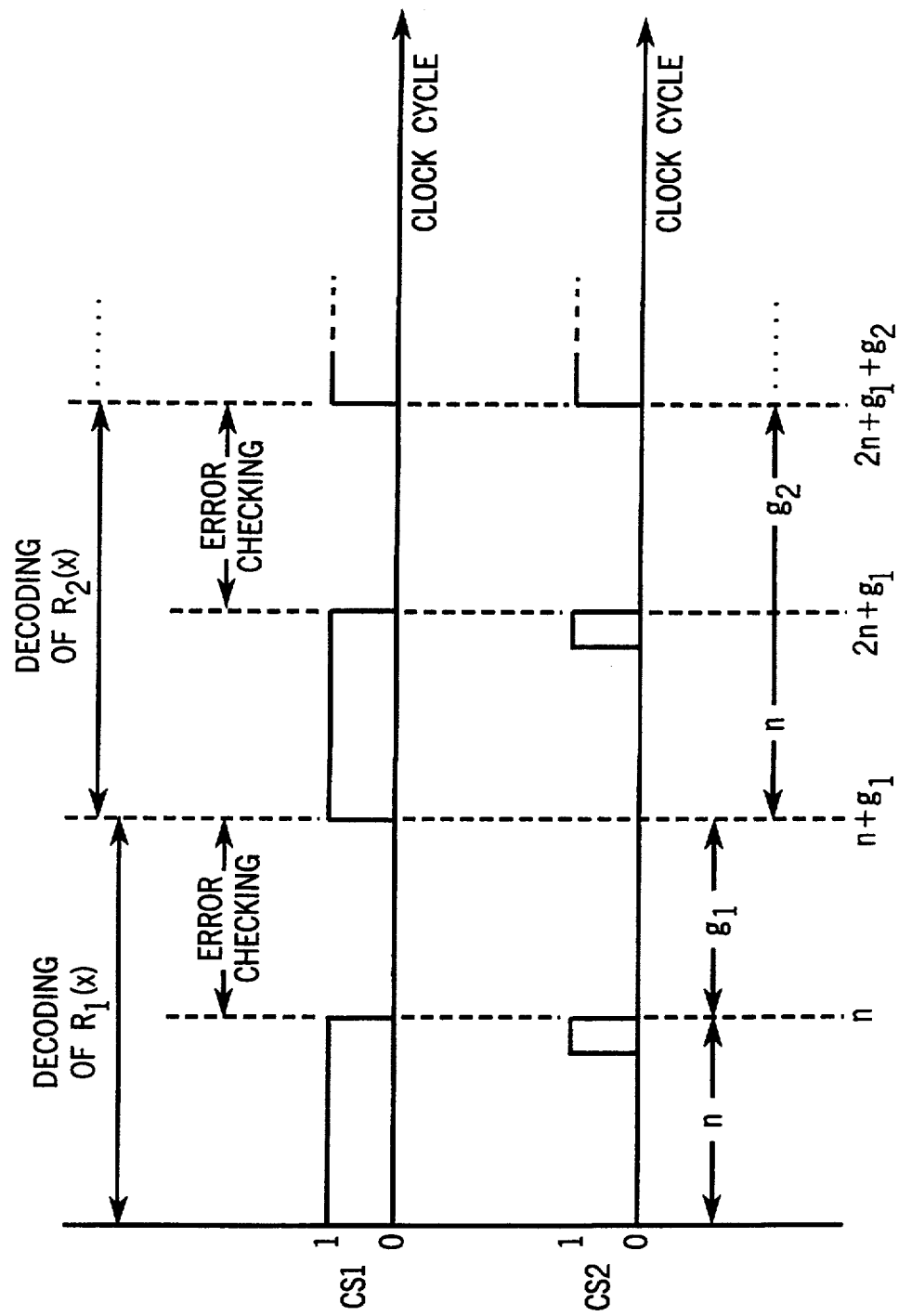
FIG. 6 illustrates the timing diagram of a control sequence $CS_1$ and a control sequence $CS_2$ utilized in the RS decoder of FIG. 5.

Referring to FIG. 6, a control sequence $CS_1$ and a control sequence $CS_2$ which are to be utilized in the RS decoder 5 of FIG. 1 will be introduced first. When the decoding of a first received word $R_1(x)$ is initiated, the control sequence $CS_1$ will present n consecutive bits of 1, during which the calculation for the syndromes $\{S_1^{(0)}, S_2^{(0)}, \ldots, S_{2t}^{(0)}\}$ of the first received word $R_1(x)$ is performed, and then present $g_i$ consecutive bits of 0, where $g_i$ represents the clock cycles needed in the error-checking process of all the symbols in the (i)th received word $R_i(x)$. When the decoding of the first received word $R_1(x)$ is completed, the control sequence $CS_1$ will again present n consecutive bits of 1 for the subsequent second received word $R_2(x)$, and so forth. The control sequence $CS_2$, as shown in the figure, presents a bit 1

16 only during the (n)th clock cycle in the decoding of a received word.

Since for each received word $g_i$ would have an uncertain and different value, the control sequence $CS_1$ can not be designed into a periodic bit sequence with a predetermined bit pattern. As a consequence, a shift control signal SHIFT is devised for indicating the completion of the error-checking process of each symbol. At the appearance of each shift control signal, i.e. when SHIFT=1, the error-checking process of the present symbol is terminated and the same process is started to be performed on the subsequent symbol. If the present symbol is the last symbol of the first received word $R_1(x)$, i.e. the symbol $r_0$, then the appearance of SHIFT=1 indicates at the same time that the decoding process for the first received $R_1(x)$ is accomplished and the same process is performed immediately on the next, i.e. the second received word $R_2(x)$. Accordingly, when the shift control signal SHIFT=1 for the symbol $r_0$ of the first received word $R_1(x)$ is present, the control sequence $CS_1$ is notified to present again n consecutive bits of 1, and so forth.

As described above, the shift control signal SHIFT is devised for indicating the completion of the error-checking process of one symbol. There are two conditions under which the error-checking process of one symbol is termed to be completed, i.e.

Condition (1): the symbol being under error checking is determined to be an erroneous symbol; and
  Condition (2): the symbol being under error checking is determined to be a correct symbol.

The Condition (1) takes places whenever a decision vector $H^{(j)}$ is found to be corresponding to a weight less by one than the weight revealed by the decision vector $H^{(0)}$. And there are three cases which may be the cause of the Condition (2):

Case (1): the case described in Corollary (1);
  Case (2): the case described in Corollary (2) with the outcome of the decision vector $H^{(j)} = [x^{t-1}, 1, 0]$; and
  Case (3): the case described in Corollary (2) without the outcome of the decision vector $H^{(j)} = [x^{t-1}, 1, 0]$ after all the error-trial values have been tested.

Therefore, it is the duty of the first decision circuit 50 to detect the occurrence of the Condition (1) and it is the duty of the second decision circuit 60 to detect the occurrence of either Case (1) or Case (2) of the Condition (2). The first decision circuit 50 will send out a signal $E_C = 1$ (Error-Correcting) whenever the occurrence of the Condition (1) is detected; and the second decision circuit 60 will send out a signal $S_C = 1$ (Symbol-is-Correct) whenever the occurrence of either Case (1) or Case (2) of the Condition (2) is detected.

To detect the occurrence of Case (3) of the Condition (2), the error-trial value generator 40 is provided with an output signal EOT (End-OF-Trial) and EOT=1 whenever the last one of the error-trial values is used. The lines of the signals $E_C$, $S_C$, and EOT are coupled to a 3-input OR gate 93 and the output of the OR gate 93 is thus defined as the shift control signal SHIFT.

As a received word $R(x)$ is sent into the RS decoder 5, the received word $R(x)$ is stored temporarily in a n-symbol buffer register 10 with the highest order symbol $r_{n-1}$ entering thereinto first. At the same time, the received word $R(x)$ is processed by the syndrome generator 10 to generate the corresponding set of syndromes $\{S_1^{(0)}, S_2^{(0)}, \ldots, S_{2t}^{(0)}\}$. Each of the syndromes is represented by an m-bit binary word and therefore is transferred via an m-line data bus to the comparison circuit 20.

The Syndrome Generator 20

Figure 7A:
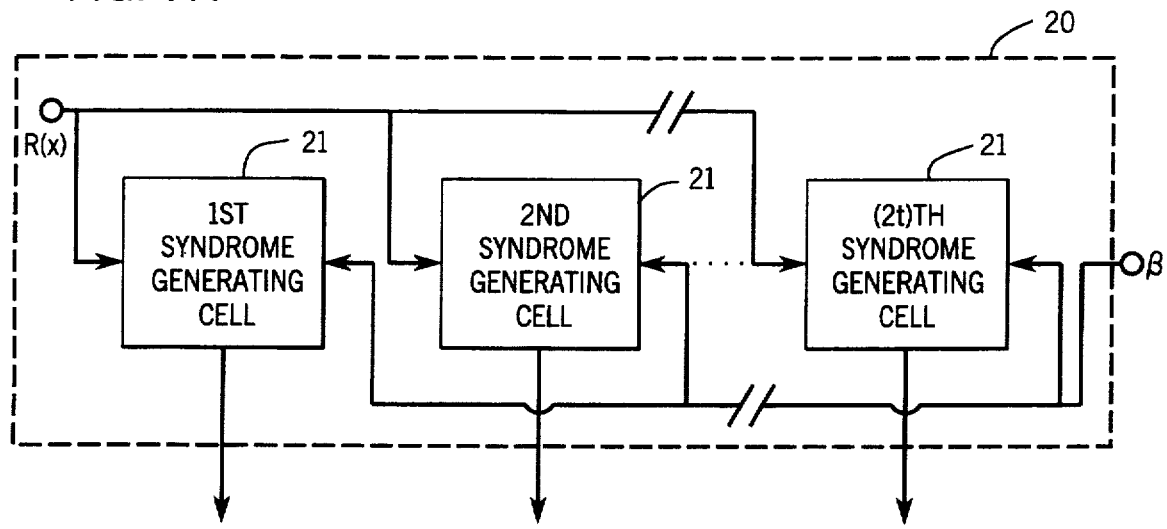
FIG. 7A shows the configuration of a syndrome generator utilized in the RS decoder of FIG. 5.
Figure 7B:
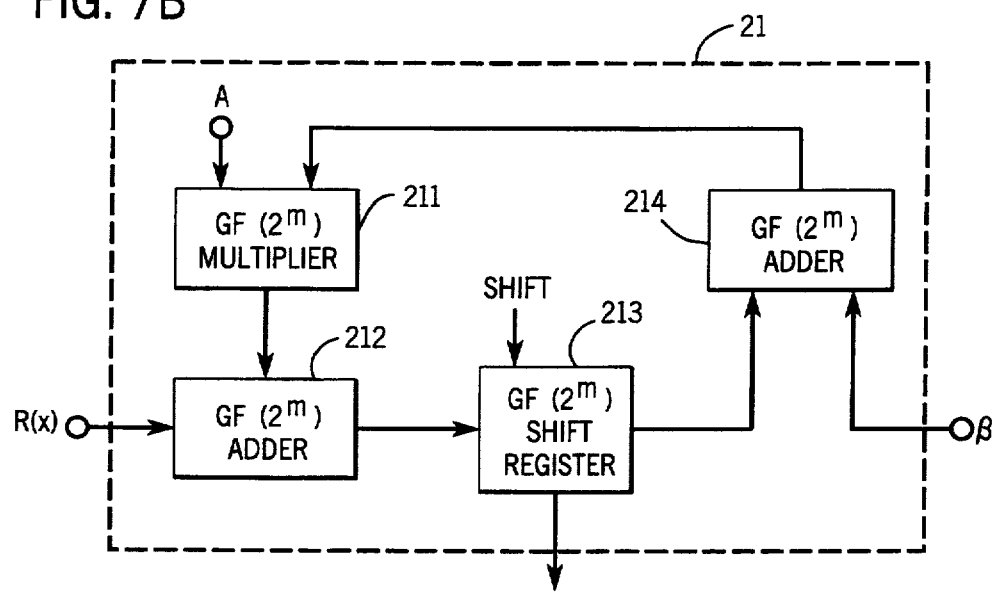
FIG. 7B shows the configuration of a syndrome generating cell utilized in the syndrome generator of FIG. 7A.

The syndrome values of a t-error-correcting RS code can be obtained by:

$$S_{(i)}^{(0)} = \text{Mod}\left(\frac{R(x)}{x + \alpha^i}\right) \quad (13)$$

for i=1,2, ..., 2t. Accordingly, the syndrome values are in GF($2^m$) and can be represented by a m-bit vector. A configuration of the syndrome generator 20 is shown in FIG. 7A, wherein the calculation of the syndromes $\{S_1^{(0)}, S_2^{(0)}, \ldots, S_{2t}^{(0)}\}$ is accomplished by employing an array of 2t syndrome generating cells 21. The configuration of one syndrome generating cell 21 is shown in FIG. 7B, which comprises a GF($2^m$) multiplier 211, two GF($2^m$) adder 212, 213, and a GF($2^m$) LFSR. circuit 214. The multiplier 211 is used to multiply the contents of the LFSR circuit 214 by the coefficients $\alpha^1, \alpha_2, \ldots, \alpha^{2t}$ which are input thereto from the port A.

The GF($2^m$) adder 213 is used to perform the STEP () in the decoding method and the function of which will be described later.

The Comparison Circuit 30

Figure 8:
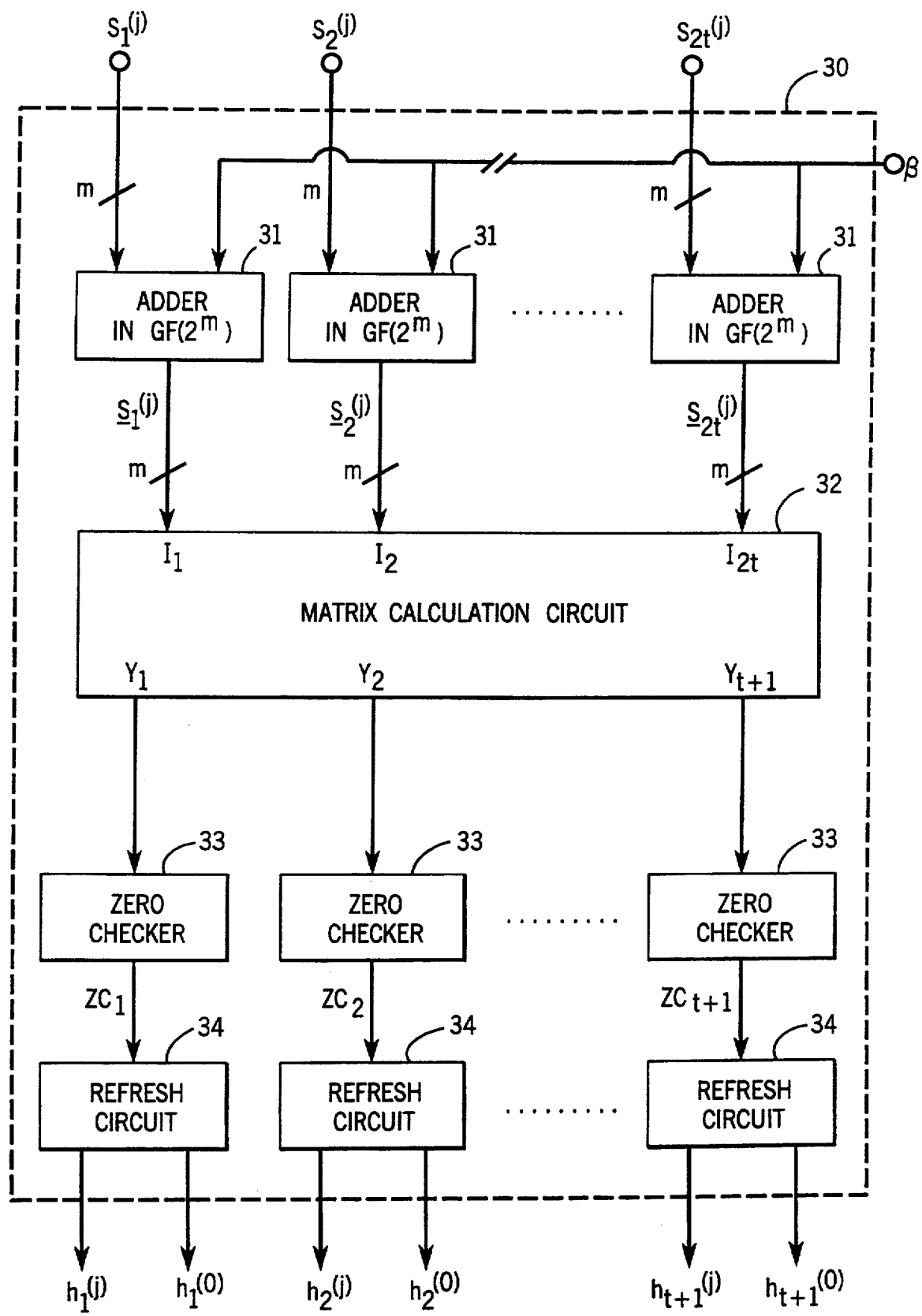
FIG. 8 shows the block diagram of a comparison circuit utilized in the RS decoder of FIG. 5.

Referring to FIG. 8, the comparison circuit 30 comprises an array of 2t GF($2^m$) adders 31, a matrix calculation circuit 32, an array of 2t zero checkers 33, and an array of 2t refresh circuits 34. Each of the GF($2^m$) adders 31 has an input connected via a multiplexer 96 to the error-trial value generator 40.

The error-trial value generator 40 is a device designed for-generating the error-trial values for use in the error-checking process of the symbols in the received word R(x) and therefore is capable of generating the GF($2^m$) elements $\{\alpha^0, \alpha^1, \alpha^2, \ldots, \alpha^{n-2}, \alpha^{-1}\}$ one after the other during each error-trial testing.

Figure 9A:
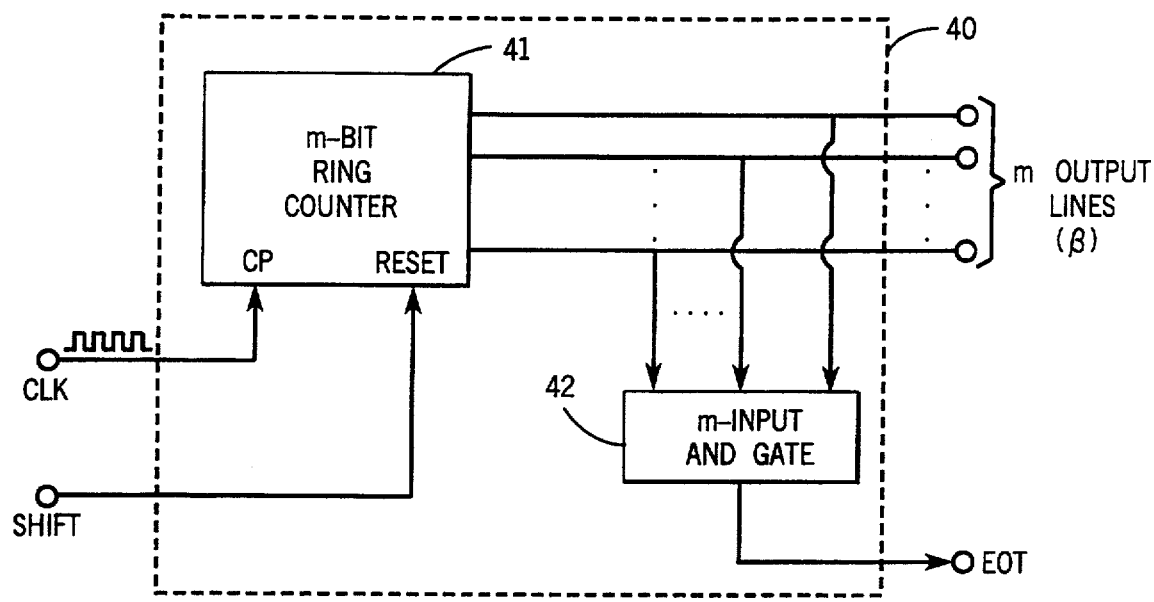
FIG. 9A shows the circuit diagram of an m-bit ring-counter utilizing in the RS decoder of FIG. 5.

As shown in FIG. 9A, an m-bit ring counter 41 capable of generating a sequence of binary numbers with the values thereof from 1 to $2^m - 1$ is employed in the configuration of the error-trial value generator 40. The ring counter 41 has an input port CP and an input port RESET. The input port CP is coupled to the system clock. Whenever a bit 1 is presented to the input port RESET, the ring counter 41 will reset the value of its output binary number to 1 and count therefrom the pulses again from the system clock. The input port RESET of the ring counter 41 is connected to the line of the signal SHIFT.

The m output lines of the ring counter 41 are by-passed to an m-input AND gate 42 whose output signal is the signal EOT. By this configuration, whenever the output binary number is at the maximum value, i.e. $2^m - 1$, all the output lines of the ring counter 41 contain a bit 1, thereby causing EOT=1. The signal EOT=1 further causes SHIFT=1 and thus the ring counter 41 is reset to the initial output binary number with a value 1.

Figure 9B:
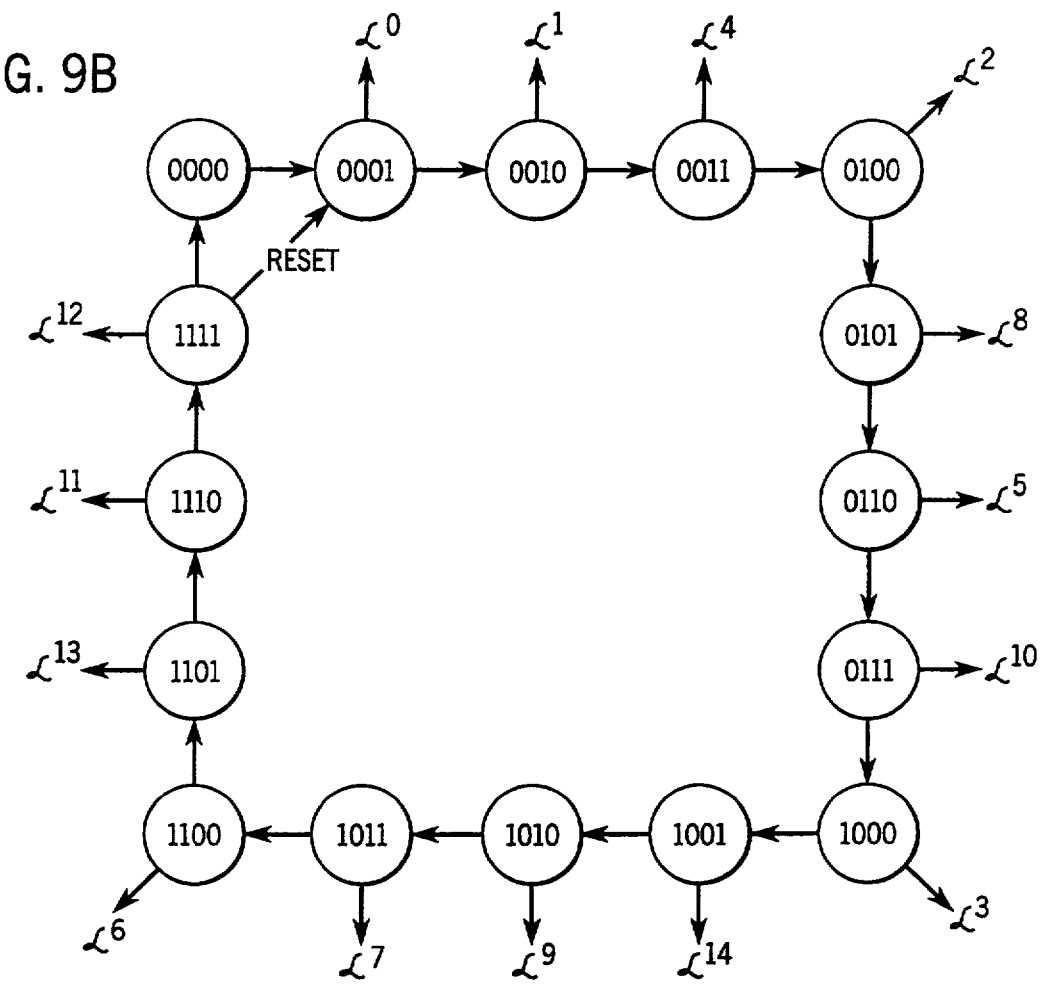
FIG. 9B shows the output state diagram of a 4-bit ring counter.

The state diagram of a 4-bit ring-counter employed for use in the decoding of (15,11,5) codewords is shown in FIG. 9B. For a (15,11,5) RS code, there are in total 15 non-zero elements in the Galois Field ($2^4$), namely $\{\alpha^0, \alpha^1, \alpha^2, \ldots, \alpha^{13}, \alpha^{14}\}$, which can be used as the error-trial values. The binary representations of the 15 elements are listed in TABLE 1 below.

TABLE 1

| Element in GF($2^4$) | Binary Representation | | | |
|---|---|---|---|---|
| $\alpha^0$ | 0 | 0 | 0 | 1 |
| $\alpha^1$ | 0 | 0 | 1 | 0 |
| $\alpha^2$ | 0 | 1 | 0 | 0 |
| $\alpha^3$ | 1 | 0 | 0 | 0 |
| $\alpha^4$ | 0 | 0 | 1 | 1 |
| $\alpha^5$ | 0 | 1 | 1 | 0 |
| $\alpha^6$ | 1 | 1 | 0 | 0 |
| $\alpha^7$ | 1 | 0 | 1 | 1 |
| $\alpha^8$ | 0 | 1 | 0 | 1 |
| $\alpha^9$ | 1 | 0 | 1 | 0 |
| $\alpha^{10}$ | 0 | 1 | 1 | 1 |
| $\alpha^{11}$ | 1 | 1 | 1 | 0 |
| $\alpha^{12}$ | 1 | 1 | 1 | 1 |
| $\alpha^{13}$ | 1 | 1 | 0 | 1 |
| $\alpha^{14}$ | 1 | 0 | 0 | 1 |

And the output of the 4-bit ring counter is given in TABLE 2 below.

TABLE 2

| Clock No. | Binary Output | | | | Equivalent element in GF($2^4$) |
|---|---|---|---|---|---|
| 1 | 0 | 0 | 0 | 1 | $\alpha^0$ |
| 2 | 0 | 0 | 1 | 0 | $\alpha^1$ |
| 3 | 0 | 0 | 1 | 1 | $\alpha^4$ |
| 4 | 0 | 1 | 0 | 0 | $\alpha^2$ |
| 5 | 0 | 1 | 0 | 1 | $\alpha^8$ |
| 6 | 0 | 1 | 1 | 0 | $\alpha^5$ |
| 7 | 0 | 1 | 1 | 1 | $\alpha^{10}$ |
| 8 | 1 | 0 | 0 | 0 | $\alpha^3$ |
| 9 | 1 | 0 | 0 | 1 | $\alpha^{14}$ |
| 10 | 1 | 0 | 1 | 0 | $\alpha^9$ |
| 11 | 1 | 0 | 1 | 1 | $\alpha^7$ |
| 12 | 1 | 1 | 0 | 0 | $\alpha^6$ |
| 13 | 1 | 1 | 0 | 1 | $\alpha^{13}$ |
| 14 | 1 | 1 | 1 | 0 | $\alpha^{11}$ |
| 15 | 1 | 1 | 1 | 1 | $\alpha^{12}$ |

It can be found from TABLE 2 that the output binary numbers of the 4-bit ring counter includes all the Galois Field elements $\{\alpha^0, \alpha^1, \alpha^2, \ldots, \alpha^{13}, \alpha^{14}\}$ except in a sequential order of:

clock: 1 2 3 4 5 6 7 8 9 10 11 12 13 14 15 16
output: $\alpha^0 \to \alpha^1 \to \alpha^4 \to \alpha^2 \to \alpha^8 \to \alpha^5 \to \alpha^{10} \to \alpha^3 \to \alpha^{14} \to \alpha^9 \to \alpha^7 \to \alpha^6 \to \alpha^{13} \to \alpha^{11} \to \alpha^{12} \to \alpha^0$ The above sequence includes all the elements in the Galois Field ($2^4$) without repetition. Since the particular order as to which element is selected as the first error trial value and which one is the next is not a matter of concern, the above sequence is surely can be employed as the error trial values.

Since a zero value 0 is not needed as an error trial value, the ring counter 41 is designed to skip the output state of zero values and each of the output binary numbers thereof is employed as an error trial value which is added to the syndromes $\{S_1^{(j)}, S_2^{(j)}, \ldots, S_{2t}^{(j)}\}$.

As the comparison circuit 30 receives in the group of syndromes $\{S_1^{(0)}, S_2^{(0)}, \ldots, S_{2t}^{(0)}\}$, the bit 0 is present to the multiplexer 96 and thus a zero value is added to each of the syndromes $\{S_1^{(0)}, S_2^{(0)}, \ldots, S_{2t}^{(0)}\}$. As a result, the syndrome values $\{S_1^{(0)}, S_2^{(0)}, \ldots, S_{2t}^{(0)}\}$ pass through the GF($2^m$) adders 31 to the matrix calculation circuit 32 without being altered in value.

When the syndrome generator 20 delivers out the syndrome values $\{S_1^{(j)}, S_2^{(j)}, \ldots, S_{2t}^{(j)}\}$, $1 \leq j \leq n-1$, the control sequence $CS_2$ presents a bit 1 to the ring counts 41 and whereby the output of the ring counter 41 is delivered to the GF($2^m$) adders 31.

The Matrix Calculation Circuit 32

The matrix calculation circuit 32 is a 2t-input and (t+1)-output device. If the 2t inputs to the matrix calculation circuit 32 are the syndrome values $\{S_1^{(0)}, S_2^{(0)}, \ldots, S_{2t}^{(0)}\}$, then the t+1 outputs of the same are the determinant values $\{\det(N_1^{(0)}), \det(N_2^{(0)}), \ldots, \det(N_t^{(0)}), \det(N'_{t+1}^{(0)})\}$. And if the 2t inputs to the matrix calculation circuit 32 are the syndrome values $\{S_1^{(j)}, S_2^{(j)}, \ldots, S_{2t}^{(j)}\}$, then the t+1 outputs of the same are the determinant values $\{\det(N_1^{(j)}), \det(N_2^{(j)}), \ldots, \det(N_t^{(j)}), \det(N'_{t+1}^{(j)})\}$.

EXAMPLE: The Matrix Calculation Circuit 32 for t=2

In this case, the syndrome matrices in accordance with theorem (1) are:

$$N_1^{(j)} = S_1^{(j)}$$

$$N_2^{(j)} = \begin{bmatrix} S_1^{(j)} & S_2^{(j)} \\ S_2^{(j)} & S_3^{(j)} \end{bmatrix}$$

$$N_3^{(j)} = \begin{bmatrix} S_1^{(j)} & S_2^{(j)} & S_3^{(j)} \\ S_2^{(j)} & S_3^{(j)} & S_4^{(j)} \\ S_3^{(j)} & S_4^{(j)} & S_5^{(j)} \end{bmatrix}$$

and therefore $$\det(N_1^{(j)}) = S_1^{(j)}$$

$$\det(N_2^{(j)}) = S_1^{(j)} \cdot S_3^{(j)} + S_2^{(j)}$$

and $$\det(N_3'^{(j)}) = \det(N_2^{(j)}) + S_5 \cdot \det(N_1^{(j)})$$

$$= S_1^{(j)} \cdot S_3^{(j)} \cdot S_5^{(j)} + S_2^{(j)} \cdot S_3^{(j)} \cdot S_3^{(j)} + S_1^{(j)} \cdot S_4^{(j)} \cdot S_2^{(j)} + (S_3^{(j)})^3 +$$

$$(S_4^{(j)})^2 \cdot S_1^{(j)} + S_5^{(j)} \cdot (S_2^{(j)})^2 + S_3^{(j)} \cdot S_1^{(j)} \cdot S_3^{(j)} + S_5^{(j)} \cdot (S_2^{(j)})^2$$

$$= (S_3^{(j)})^3 + (S_4^{(j)})^2 \cdot S_1^{(j)}$$

Figure 10:
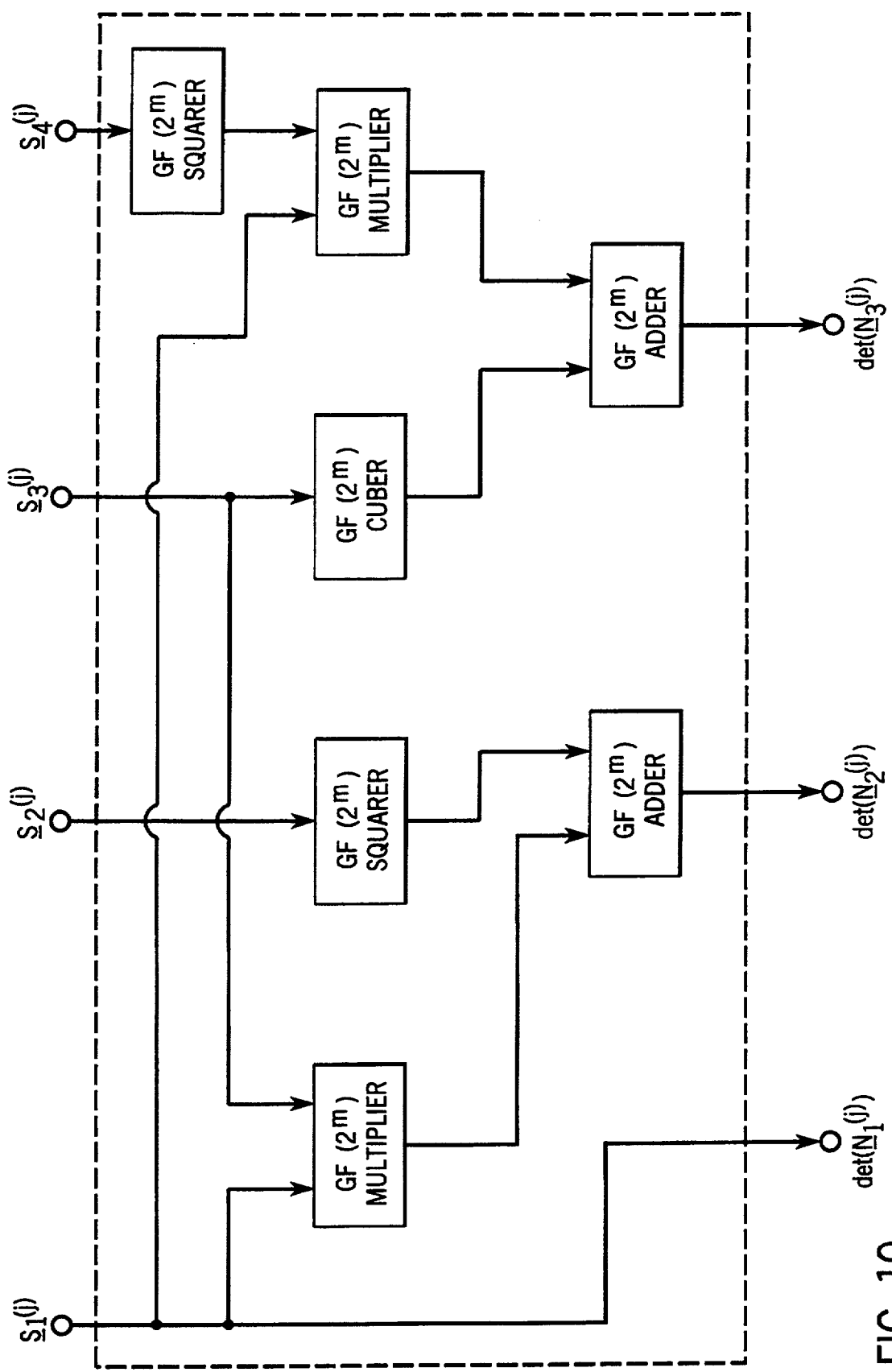
FIG. 10 shows the configuration of a matrix calculation circuit utilized in a double-error-correcting (t=2) RS decoder.

The configuration of a matrix calculation circuit for performing the above arithmetic operations is shown in FIG. 10.

EXAMPLE: The Matrix Calculation Circuit 32 for t=3

In this case, the syndrome matrices in accordance with theorem (1) are:

$$N_1^{(j)} = S_1^{(j)}$$

$$N_2^{(j)} = \begin{bmatrix} S_1^{(j)} & S_2^{(j)} \\ S_2^{(j)} & S_3^{(j)} \end{bmatrix}$$

$$N_3^{(j)} = \begin{bmatrix} S_1^{(j)} & S_2^{(j)} & S_3^{(j)} \\ S_2^{(j)} & S_3^{(j)} & S_4^{(j)} \\ S_3^{(j)} & S_4^{(j)} & S_5^{(j)} \end{bmatrix}$$

and $$N_4^{(j)} = \begin{bmatrix} S_1^{(j)} & S_2^{(j)} & S_3^{(j)} & S_4^{(j)} \\ S_2^{(j)} & S_3^{(j)} & S_4^{(j)} & S_5^{(j)} \\ S_3^{(j)} & S_4^{(j)} & S_5^{(j)} & S_6^{(j)} \\ S_4^{(j)} & S_5^{(j)} & S_6^{(j)} & S_7^{(j)} \end{bmatrix}$$

and therefore $$\det(N_1^{(j)}) = S_1^{(j)}$$

$$\det(N_2^{(j)}) = S_1^{(j)} \cdot S_3^{(j)} + (S_2^{(j)})^2$$

$$\det(N_3^{(j)})$$
$$= S_1^{(j)} \cdot S_3^{(j)} \cdot S_5^{(j)} + S_2^{(j)} \cdot S_4^{(j)} \cdot S_3^{(j)} + S_3^{(j)} \cdot S_2^{(j)} \cdot S_4^{(j)} + (S_3^{(j)})^3 +$$

$$(S_4^{(j)})^2 \cdot S_1^{(j)} + S_5^{(j)} \cdot (S_2^{(j)})^2$$

$$= [S_1^{(j)} \cdot S_3^{(j)} + (S_2^{(j)})^2] \cdot S_5^{(j)} + (S_3^{(j)})^3 + (S_4^{(j)})^2 \cdot S_1^{(j)}$$

$$\det(N_4'^{(j)}) = \det(N_4^{(j)}) + S_7^{(j)} \cdot \det(N_3^{(j)})$$

$$= S_1^{(j)} \cdot \det\begin{bmatrix} S_3^{(j)} & S_4^{(j)} & S_5^{(j)} \\ S_4^{(j)} & S_5^{(j)} & S_6^{(j)} \\ S_5^{(j)} & S_6^{(j)} & S_7^{(j)} \end{bmatrix} +$$

$$S_2^{(j)} \cdot \det\begin{bmatrix} S_2^{(j)} & S_4^{(j)} & S_5^{(j)} \\ S_4^{(j)} & S_5^{(j)} & S_6^{(j)} \\ S_5^{(j)} & S_6^{(j)} & S_7^{(j)} \end{bmatrix} + S_5^{(j)} \cdot \det\begin{bmatrix} S_2^{(j)} & S_3^{(j)} & S_5^{(j)} \\ S_4^{(j)} & S_5^{(j)} & S_6^{(j)} \\ S_6^{(j)} & S_5^{(j)} & S_7^{(j)} \end{bmatrix} +$$

$$S_6^{(j)} \cdot \det\begin{bmatrix} S_2^{(j)} & S_3^{(j)} & S_4^{(j)} \\ S_4^{(j)} & S_5^{(j)} & S_6^{(j)} \\ S_6^{(j)} & S_5^{(j)} & S_4^{(j)} \end{bmatrix}$$

$$= S_1^{(j)} \cdot \{S_3^{(j)} \cdot S_5^{(j)} \cdot S_6^{(j)} + (S_4^{(j)})^3 + (S_5^{(j)})^2 \cdot S_5^{(j)} + S_3^{(j)} \cdot (S_6^{(j)})^2\} +$$

$$S_3^{(j)} \cdot \{S_1^{(j)} \cdot S_4^{(j)} \cdot S_6^{(j)} + (S_3^{(j)})^3 \cdot S_5^{(j)} + S_2^{(j)} \cdot S_4^{(j)} \cdot S_5^{(j)} +$$

$$S_3^{(j)} \cdot (S_4^{(j)})^2 + S_2^{(j)} \cdot (S_3^{(j)})^2 + S_2^{(j)} \cdot S_5^{(j)} \cdot S_6^{(j)}\} + S_6^{(j)} \cdot$$

$$\{S_1^{(j)} \cdot S_3^{(j)} \cdot S_6^{(j)} + S_2^{(j)} \cdot S_4^{(j)} \cdot S_5^{(j)} + S_3^{(j)} \cdot (S_4^{(j)})^2 + (S_3^{(j)})^2 \cdot$$

$$S_4^{(j)} + (S_2^{(j)})^2 \cdot S_6^{(j)} + S_1^{(j)} \cdot S_4^{(j)} \cdot S_5^{(j)}\}$$

$$= \{S_2^{(j)} \cdot (S_4^{(j)})^2 \cdot S_6^{(j)} + (S_4^{(j)})^3 + (S_5^{(j)})^2 \cdot S_4^{(j)} \cdot S_6^{(j)} +$$

$$S_3^{(j)} \cdot S_4^{(j)} \cdot (S_6^{(j)})^2\} + \{S_1^{(j)} \cdot S_4^{(j)} \cdot S_5^{(j)} \cdot S_6^{(j)} + (S_3^{(j)})^3 \cdot (S_5^{(j)})^2 +$$

$$S_2^{(j)} \cdot S_4^{(j)} \cdot (S_5^{(j)})^2 + S_2^{(j)} \cdot (S_5^{(j)})^2 \cdot S_4^{(j)} + S_1^{(j)} \cdot (S_5^{(j)})^3 + S_2^{(j)} \cdot$$

$$S_3^{(j)} \cdot S_5^{(j)} \cdot S_6^{(j)}\} + \{S_1^{(j)} \cdot S_3^{(j)} \cdot (S_6^{(j)})^2 + S_2^{(j)} \cdot S_3^{(j)} \cdot S_5^{(j)} \cdot S_6^{(j)} +$$

$$S_2^{(j)} \cdot (S_5^{(j)})^2 \cdot S_6^{(j)} + (S_3^{(j)})^2 \cdot S_4^{(j)} \cdot S_6^{(j)} + (S_2^{(j)})^2 \cdot (S_6^{(j)})^2 +$$

$$S_1^{(j)} \cdot S_4^{(j)} \cdot S_5^{(j)} \cdot S_6^{(j)}\}$$

$$= (S_4^{(j)})^4 + (S_3^{(j)})^2 \cdot (S_5^{(j)})^2 + S_1^{(j)} \cdot (S_5^{(j)})^2 \cdot S_5^{(j)} +$$

$$S_1^{(j)} \cdot (S_5^{(j)})^3 + S_1^{(j)} \cdot S_3^{(j)} \cdot (S_6^{(j)})^2 + (S_2^{(j)})^2 \cdot (S_6^{(j)})^2$$

$$= (S_6^{(j)})^2 \cdot [S_1^{(j)} \cdot S_3^{(j)} + (S_2^{(j)})^2] + [S_1^{(j)} \cdot (S_5^{(j)})]^2 +$$

$$[S_1^{(j)} \cdot S_5^{(j)} + (S_3^{(j)})^2] \cdot (S_5^{(j)})^2 + S_1^{(j)} \cdot (S_5^{(j)})^3$$

$$= (S_6^{(j)})^2 \cdot \det(N_2^{(j)}) + [S_1^{(j)} \cdot S_5^{(j)}]^2 + [S_1^{(j)} \cdot S_5^{(j)} +$$

$$(S_3^{(j)})^2] \cdot (S_5^{(j)})^2 + S_1^{(j)} \cdot (S_5^{(j)})^3$$

Figure 11A:
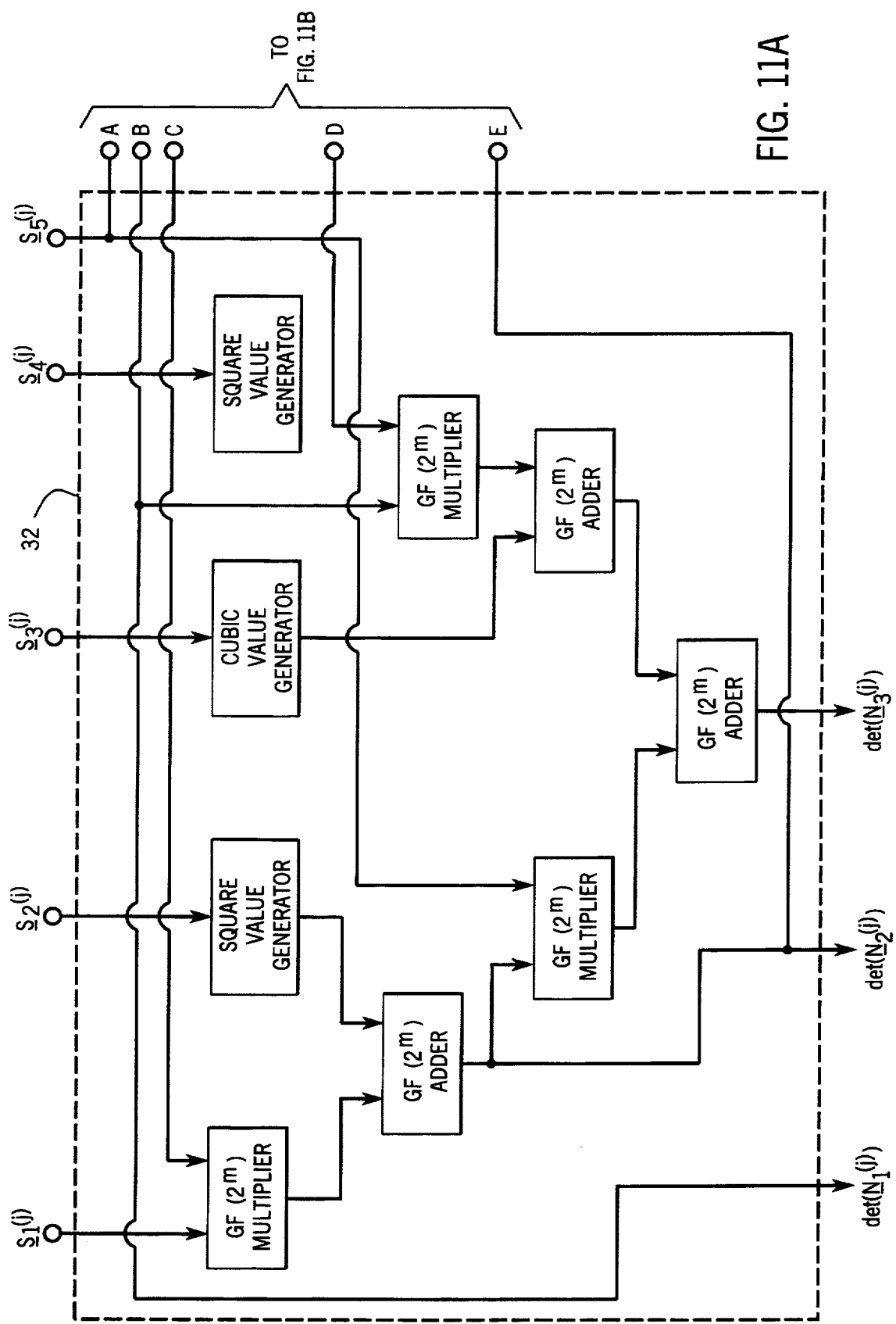
FIGS. 11A-11B jointly show the configuration of a matrix calculation circuit utilized in a triple-error-correcting (t=3) RS decoder.
Figure 11B:
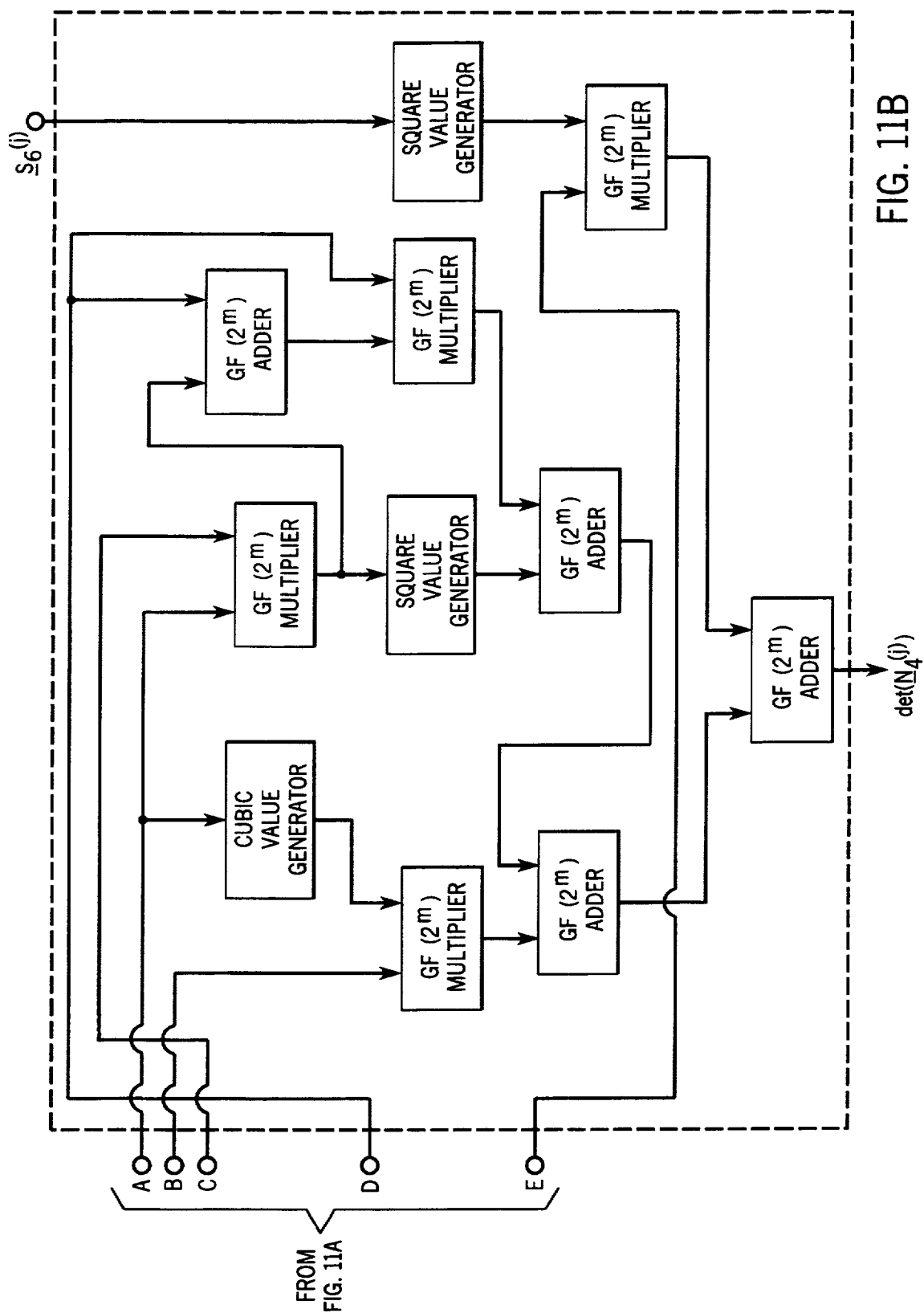

The configuration of a matrix calculation circuit for performing the above arithmetic operations is shown separately with a part in FIG. 11A and another part in FIG. 11B. Readers could combine the two drawings with FIG. 11A at the left-hand side and FIG. 11B at the right-hand side for a whole view of the circuit configuration.

The Zero-checker 33

The zero checker 33 is a logic circuit designed for checking if each of the values of the determinants $\{\det(N_1^{(j)}), \det(N_2^{(j)}), \ldots, \det(N_t^{(j)}), \det(N_{t+1}'^{(j)})\}$ is zero or non-zero. If a certain determinant value is detected to be zero, a bit of $Z_c=1$ is sent out from the associated zero checker; and if not zero, a bit of $Z_c=0$ is sent out.

Figure 12:
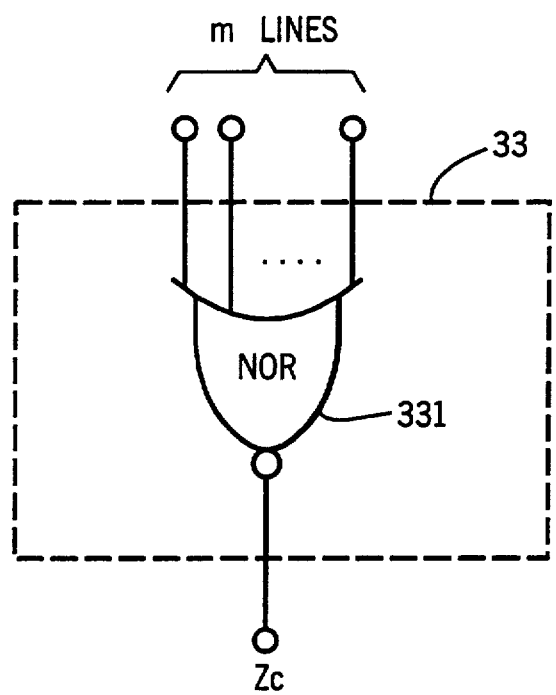
FIG. 12 shows the configuration of a zero-checking circuit utilized in the comparison circuit of FIG. 8.

As shown in FIG. 12, the zero checker 33 can be easily implemented by using an m-input NOR gate 331. If all the input lines are 0s, then the NOR gate 331 outputs a bit of 1. Otherwise, if any one of the input lines is not 0, the NOR gate 331 outputs a bit 0.

The Refresh Circuit 34

Figure 13:
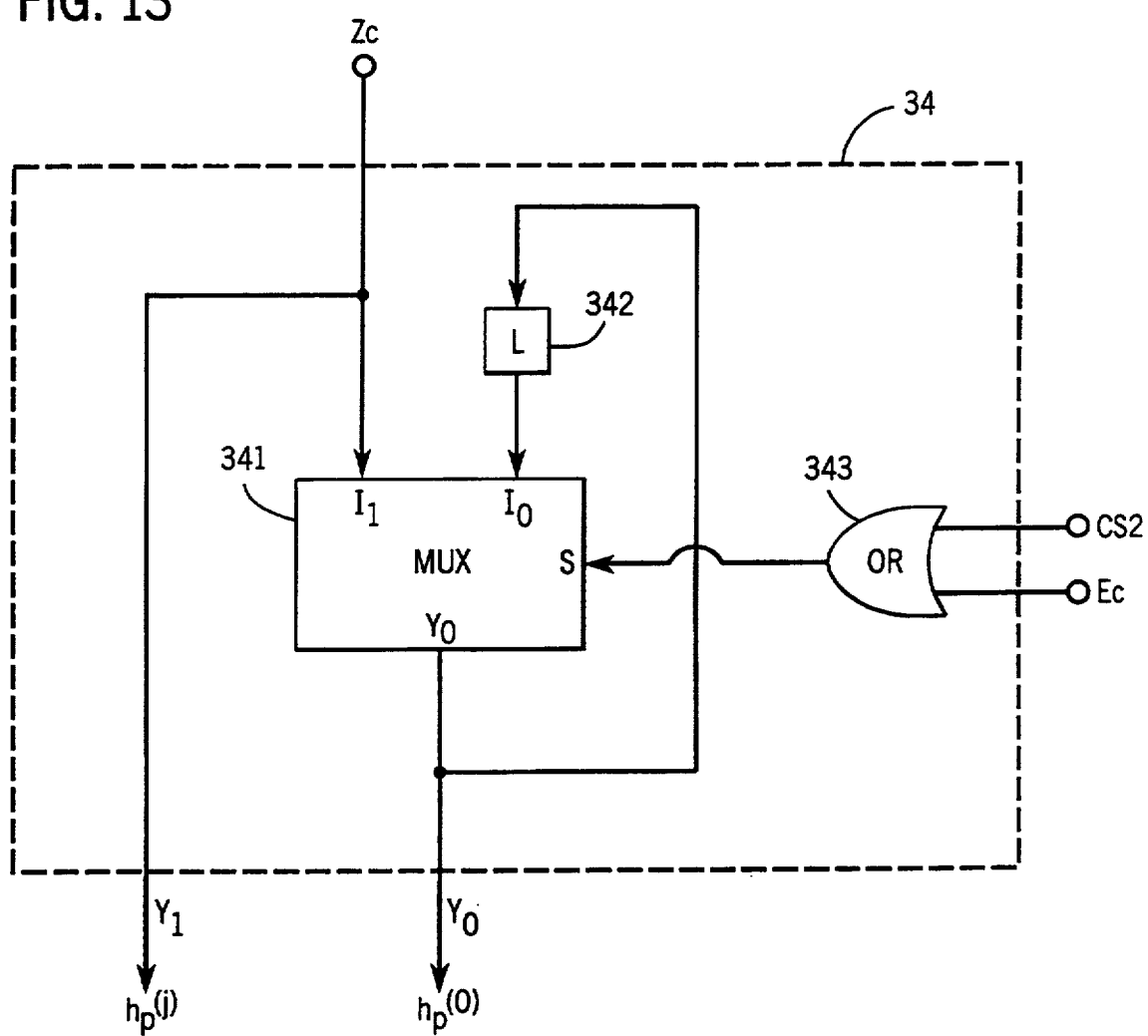
FIG. 13 shows the configuration of a fresh circuit utilized in the comparison circuit of FIG. 8.

Referring to FIG. 13, each of the refresh circuits 34 is coupled to the output of each of the zero checker 33 and comprises a multiplexer 341, a latch 342, and an OR gate 343. The refresh circuit 34 has an output port $Y_0$ for $h_p^{(0)}$ and an output port $Y_1$ for $h_p^{(j)}$. During the (n)th clock cycle in the decoding process of the received word R(x), an output $ZC_p$ of the (p)th zero checker corresponding to the decision bit $h_p^{(0)}$ is received by the refresh circuit 34 and at this time a bit 1 is presented by the control sequence $CS_2$ whereby the value of the $ZC_p$ is selected as the output of the multiplexer 341 and is also stored in the latch 342.

During the subsequent clock cycles, since the error-checking process is initiated, the bits provided by the control sequence $CS_2$ are all 0s during this period. As a consequence, the bit stored in the latch 342 is maintained at the output port $Y_0$ of the refresh circuit 34. The signal $ZC_p$ received during the error-checking process corresponds to the decision bits $h_p^{(j)}$ which is rejected by the multiplexer 341 and thereby is delivered out from the port $Y_1$ of the refresh circuit 34.

The multiplexer 341 is further controlled by the signal $E_C$ which is the output of the first decision circuit 50. This provision is related to the performing of the STEP (12) in the decoding method. When $E_C=1$ is present to the refresh circuit 34, the decision bit appearing at this time at the output port $Y_1$ is delivered through the multiplexer 341 to the latch 342 and replaces the bit $h_p^{(0)}$.

The First Decision Circuit 50

The first decision circuit 50 is designed to send out a correcting signal $E_C=1$ if a symbol is found to be an erroneous symbol; otherwise the first decision circuit 50 sends out a signal $E_C=0$.

Accordingly, $E_C=1$ when $H^{(0)} \in \phi_q$ and $H^{(j)} \in \phi_{q-1}$. If a certain decision vector $H^{(j)}$ is determined to be corresponding to an erroneous symbol, then the erroneous symbol is $r_{n-j}$ which, during this clock cycle, has been shifted j times to the right and thus the symbol $r_{n-j}$ is at this time located at the right-most position of the decoding delay buffer 10. The output of the error-trial value generator 40 at this instant is therefore equal to the symbol error value of the symbol $r_{n-j}$. The signal $E_C=1$ enables the multiplexer 95 to select the signal appearing at its input port $I_1$ and therefore the output of the error-trial value generator 40 is transferred to the $GF(2^m)$ adder 70 coupled to the output of the buffer register 10 and whereby the symbol $r_{n-j}$ is corrected by added with the symbol error value. Accordingly, reading the output of the $GF(2^m)$ adder 51, a corrected symbol $r_{n-j}$ can be received.

The Second Decision Circuit 60

The output signal $S_C$ of the second decision circuit 60 indicates that a symbol being under error checking is determined to be a correct symbol in accordance with Corollary (1) and Corollary (2). Once the signal $S_C=1$ is present, the RS decoder simply delivers out the present symbol and performs the error-checking process on the subsequent symbol. Therefore, the signal $S_C$ is taken only as the shift-control signal SHIFT.

The configurations for the first decision circuit 50 and the second decision circuit 60 involves only the basic principles of combinatorial logic circuit design. Examples are given hereinunder respectively for the case of $t=2$ and for the case of $t=3$.

EXAMPLE: The First Decision Circuit 50 for $t=2$

In this case, $E_C=1$ only when the following conditions are satisfied:

(1) $H^{(0)} = [0, 1, 1] \in \phi_1$, and $H^{(j)} = [1, 1, 1] \in \phi_0$, or (2) $H^{(0)} = [x, 0, x] \in \phi_2$, and $H^{(j)} = [0, 1, 1] \in \phi_1$, Since in general the decision vectors $H^{(0)}$ and $H^{(j)}$ are defined as:

$H^{(0)} = [h_1^{(0)}, h_2^{(0)}, h_3^{(0)}]$, and $H^{(j)} = [h_1^{(j)}, h_2^{(j)}, h_3^{(j)}]$, the bit $E_C$ can be expressed in a Boolean function as:

$$\begin{aligned} E_C &= \overline{h}_1^{(0)} \cdot h_2^{(0)} \cdot h_3^{(0)} \cdot h_1^{(j)} \cdot h_2^{(j)} \cdot h_3^{(j)} + \\ &\quad \overline{h}_2^{(0)} \cdot \overline{h}_1^{(j)} \cdot h_2^{(j)} \cdot h_3^{(j)} \\ &= h_2^{(j)} \cdot h_3^{(j)} \cdot [(h_2^{(0)} h_3^{(0)}) \cdot (\overline{h}_1^{(0)} \cdot h_1^{(j)}) + \\ &\quad \overline{h}_2^{(0)} \cdot \overline{h}_1^{(j)}] \end{aligned}$$

Figure 14:
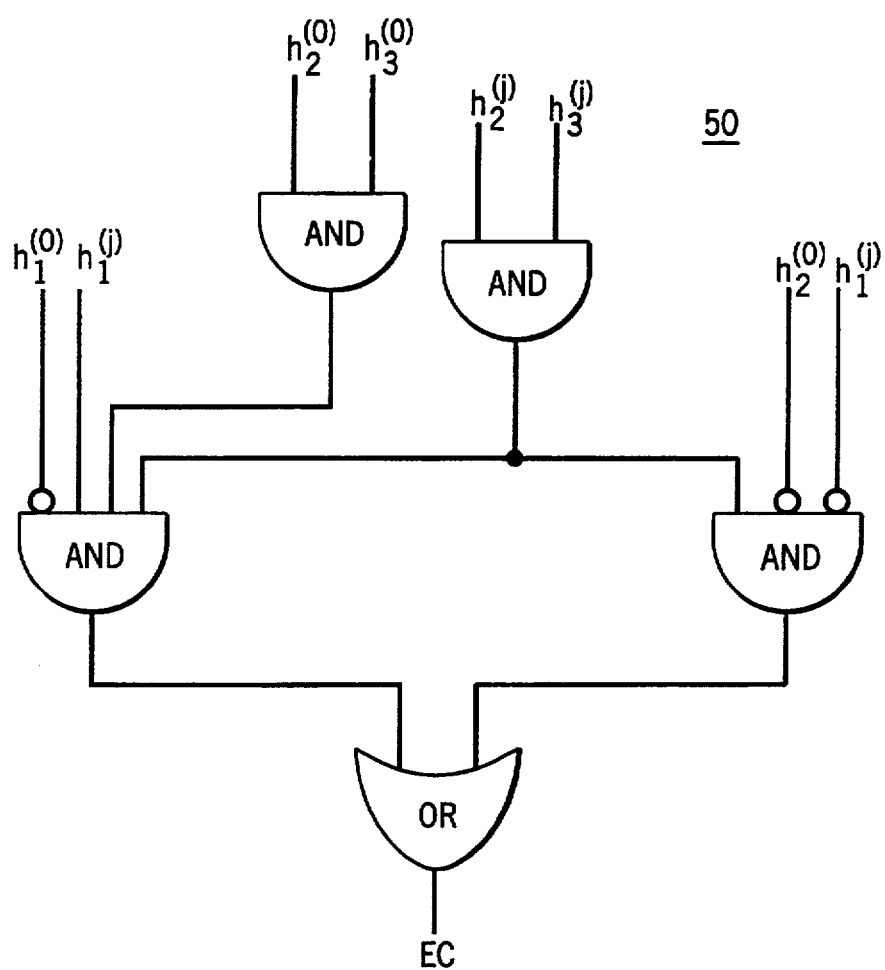
FIG. 14 shows the configuration of a first decision circuit utilized in a double-error-correcting (t=2) RS decoder.

A logic circuit configured for performing the above Boolean function is shown in FIG. 14.

EXAMPLE: The Second Decision Circuit 60 for $t=2$

In this case, $S_C=1$ when the following conditions are met:

(1) $H^{(0)} = [1, 1, 1] \in \phi_0$, and $H^{(j)} = [0, 1, 1] \in \phi_1$, or (2) $H^{(0)} = [0, 1, 1] \in \phi_1$, and $H^{(j)} = [x, 0, x] \in \phi_2$, in accordance with Corollary (1), or (3) $H^{(0)} = [x, 0, x] \in \phi_2$, and $H^{(j)} = [x, 1, 0] \in \phi_3$, in accordance with Corollary (2).

Since in general the decision vectors $H^{(0)}$ and $H^{(j)}$ are defined as:

$$H^{(0)} = [h_1^{(0)}, h_2^{(0)}, h_3^{(0)}], \text{ and}$$

$$H^{(j)} = [h_1^{(j)}, h_2^{(j)}, h_3^{(j)}],$$

the bit $S_c$ can be expressed in a Boolean function as:

$$\begin{aligned} S_c &= h_1^{(0)} \cdot h_2^{(0)} \cdot h_3^{(0)} \cdot \overline{h}_1^{(j)} \cdot h_2^{(j)} \cdot h_3^{(j)} + \\ &\quad \overline{h}_1^{(0)} \cdot h_2^{(0)} \cdot h_3^{(0)} \cdot \overline{h}_1^{(j)} + h_2^{(0)} \cdot h_2^{(j)} \cdot h_3^{(j)} \\ &= (h_1^{(0)} \cdot h_2^{(0)} \cdot h_3^{(0)} \cdot h_2^{(j)} \cdot h_3^{(j)} \cdot h_1^{(j)} + \\ &\quad (h_1^{(0)} \cdot h_2^{(j)}) \cdot (h_2^{(0)} \cdot h_3^{(0)}) + \overline{h}_2^{(0)} \cdot h_2^{(j)} \cdot \overline{h}_3^{(j)} \end{aligned}$$

Figure 15:
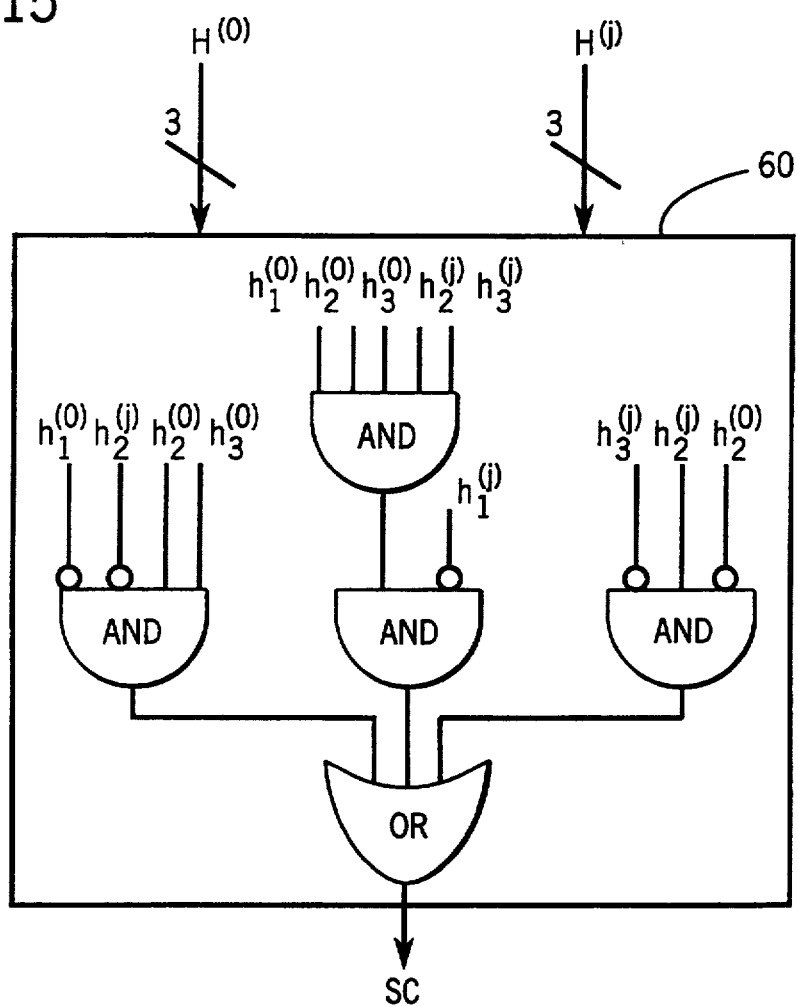
FIG. 15 shows the configuration of a second decision circuit utilized in a double-error-correcting (t=2) RS decoder.

A logic circuit configured for performing the above Boolean function is shown in FIG. 15.

For a triple-error-correcting RS decoder, it is necessary to distinguish the sets of $\phi_0$, $\phi_1$, $\phi_2$, $\phi_3$ and $\phi_4$ where $\phi_0 = \{[1,1,1,1]\}$ $\phi_1 = \{[0,1,1,1]\}$ $\phi_2 = \{[x,0,1,1]\}$ $\phi_3 = \{[x,x,0,x]\}$ $\phi_4 = \{[x,x,0,x], [x,x,1,0]\}$ EXAMPLE: The First Decision Circuit 50 for $t=3$ In this case, $E_C = 1$ only when the following conditions are satisfied:

(1) $H^{(0)} \in \phi_1 = \{[0, 1, 1, 1]\}$, and
$H^{(j)} \in \phi_0 = \{[1, 1, 1, 1]\}$, or (2) $H^{(0)} \in \phi_2 = \{[x, 0, 1, 1]\}$, and
$H^{(j)} \in \phi_1 = \{[0, 1, 1, 1]\}$, (3) $H_{(0)} \in \phi_3 = \{[x, x, 0, x]\}$, and
$H^{(j)} \in \phi_2 = \{[x, 0, 1, 1]\}$, Since in general the decision vectors $H^{(0)}$ and $H^{(j)}$ are defined as:

$$H^{(0)} = [h_1^{(0)}, h_2^{(0)}, h_3^{(0)}, h_4^{(0)}], \text{ and}$$

$$H^{(j)} = [h_1^{(j)}, h_2^{(j)}, h_3^{(j)}, h_4^{(j)}],$$

the bit $E_C$ can be expressed in a Boolean function as:

$$\begin{aligned} E_C &= h_1^{(0)} \cdot h_2^{(0)} \cdot h_3^{(0)} \cdot h_4^{(0)} \cdot h_1^{(j)} \cdot h_2^{(j)} \cdot h_3^{(j)} \cdot h_4^{(j)} + \\ &\quad \overline{h}_2^{(0)} \cdot h_3^{(0)} \cdot h_4^{(0)} \cdot \overline{h}_1^{(j)} \cdot h_2^{(j)} \cdot h_3^{(j)} \cdot h_4^{(j)} + \\ &\quad \overline{h}_3^{(0)} \cdot \overline{h}_2^{(j)} \cdot h_3^{(j)} \cdot h_4^{(j)} \\ &= h_3^{(0)} \cdot h_4^{(0)} \cdot h_1^{(j)} \cdot h_2^{(j)} \cdot h_3^{(j)} \cdot [\overline{h}_1^{(0)} \cdot h_2^{(0)} \cdot h_4^{(j)} + \\ &\quad \overline{h}_2^{(0)} \cdot \overline{h}_1^{(j)}] + \overline{h}_3^{(0)} \cdot \overline{h}_2^{(j)} \cdot h_3^{(j)} \cdot h_4^{(j)} \end{aligned}$$

Figure 16:
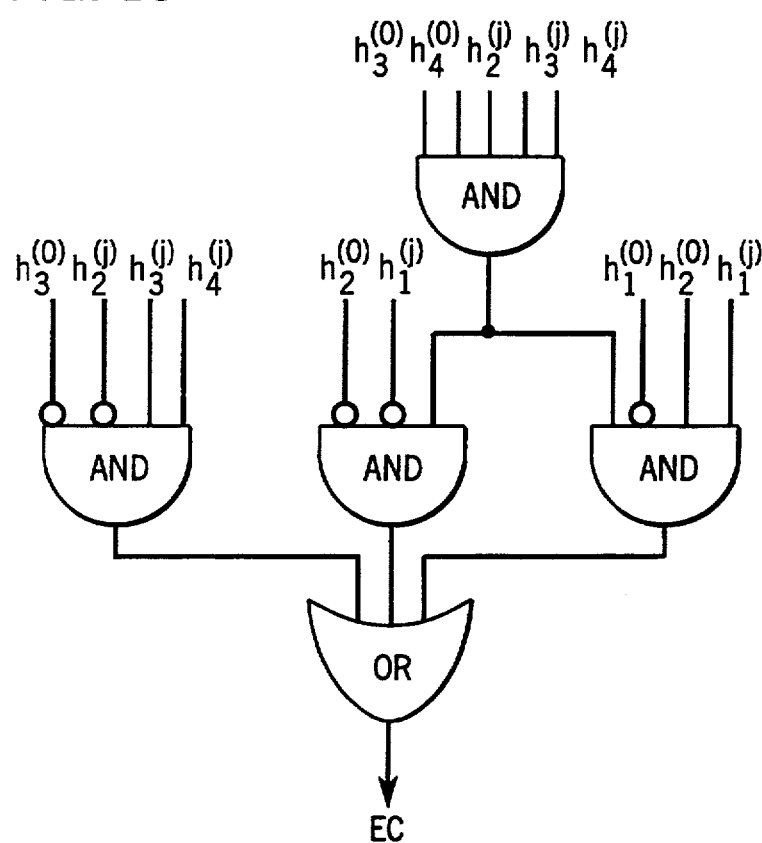
FIG. 16 shows the configuration of a first decision circuit utilized in a triple-error-correcting (t=3) RS decoder.

A logic circuit configured for performing the above Boolean function is shown in FIG. 16.

EXAMPLE: The Second Decision circuit 60 for $t=3$

In this case, $S_C = 1$ only when the following conditions are satisfied:

(1) $H^{(0)} \in \phi_0 = \{[1, 1, 1, 1]\}$, and
$H^{(j)} \in \phi_1 = \{[0, 1, 1, 1]\}$, or (2) $H^{(0)} \in \phi_1 = \{[0, 1, 1, 1]\}$, and
$H^{(j)} \in \phi_2 = \{[x, 0, 1, 1]\}$, or (3) $H^{(0)} \in \phi_2 = \{[x, 0, 1, 1]\}$, and
$H^{(j)} \in \phi_3 = \{[x, x, 0, x]\}$, or (4) $H^{(0)} \in \phi_3 = \{[x, x, 0, x]\}$, and
$H^{(j)} \in \phi_4 = \{[x, x, 1, 0]\}$, where (1)–(3) are in accordance with Corollary (1) and (4) is in accordance with Corollary (2). Since in general the decision vectors $H^{(0)}$ and $H^{(j)}$ are defined as:

$$H^{(0)} = [h_1^{(0)}, h_2^{(0)}, h_3^{(0)}, h_4^{(0)}], \text{ and}$$

$$H^{(j)} = [h_1^{(j)}, h_2^{(j)}, h_3^{(j)}, h_4^{(j)}],$$

the bit $S_C$ can be expressed in a Boolean function as:

$$\begin{aligned} S_C &= h_1^{(0)} \cdot h_2^{(0)} \cdot h_3^{(0)} \cdot h_4^{(0)} \cdot \overline{h}_1^{(j)} \cdot h_2^{(j)} \cdot h_3^{(j)} \cdot h_4^{(j)} + \\ &\quad \overline{h}_1^{(0)} \cdot h_2^{(0)} \cdot h_3^{(0)} \cdot h_4^{(0)} \cdot \overline{h}_2^{(j)} \cdot h_3^{(j)} \cdot h_4^{(j)} + \\ &\quad \overline{h}_2^{(0)} \cdot h_3^{(0)} \cdot h_4^{(0)} \cdot h_4^{(j)} + \overline{h}_3^{(0)} \cdot h_3^{(j)} \cdot h_4^{(j)} \\ &= h_2^{(0)} \cdot h_3^{(0)} \cdot h_4^{(0)} \cdot h_4^{(j)} \cdot h_3^{(j)} \cdot [h_1^{(0)} \cdot h_1^{(j)} \cdot h_2^{(j)} + \\ &\quad h_1^{(0)} \cdot h_2^{(j)}] + h_2^{(0)} \cdot h_3^{(0)} \cdot h_4^{(0)} \cdot h_3^{(j)} h_3^{(j)} \cdot h_3^{(j)} \cdot h_4^{(j)} \end{aligned}$$

Figure 17:
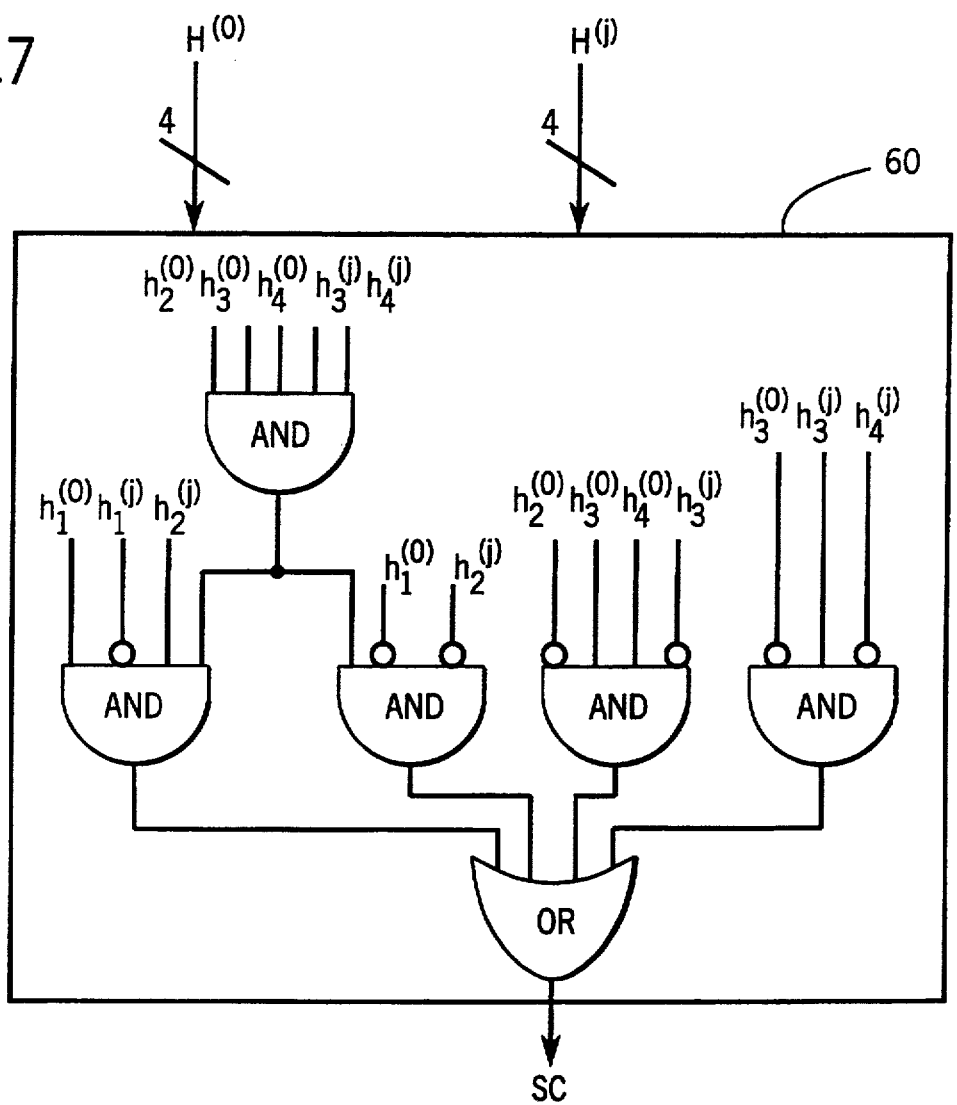
FIG. 17 shows the configuration of a second decision circuit utilized in a triple-error-correcting (t=3) RS decoder.

A logic circuit configured for performing the above Boolean function is shown in FIG. 17.

It has been mentioned in the description of the decoding method that the case of Corollary (1) can be reduced to the case of Corollary (2) after the first found erroneous symbol has been corrected. In the case of Corollary (2), the error-checking process of a correct symbol could be as few as only one error-trial step or as many as n error-trial steps; while in the case of Corollary (1), the same process needs precisely only one error-trial step. As a consequence, the processing speed can be significantly increased by applying this doctrine.

Therefore, referring back to FIG. 5 where the RS decoder is shown, at the time $E_C = 1$ is present, the output, i.e. the symbol error value, of the error-trial value generator 40, in addition to being used to correct an erroneous symbol, is delivered into the syndrome generating module 20. Further referring back to FIG. 7B where the configuration of the syndrome generating module 20 is shown, the symbol error value is added to the syndrome values currently stored in the $GF(2^m)$ LFSR circuit. In other words, if the decision vector causing the output $E_C = 1$ is $H^{(p)}$, $1 \leq p \leq n = 1$ and the error-trial value is equal to the symbol error value $a^s$, the following operation is performed:

$$S_i^{(p)} = S_i^{(p)} a^s \quad i = 1, 2, \ldots 2t$$

Since the configuration of the comparison module utilizes only a static logic circuit, a decision vector $H^{(p)}$ corresponding to the new syndrome values is immediately produced. Referring back to FIG. 13 where the refresh circuit 34 is shown, the presence of $E_C = 1$ causes the multiplexer 341 to select the decision bit of $H^{(p)}$ to the output port $Y_0$. As a result, for the subsequent error-checking process of the symbols in the same received word, the RS decoder will compare the decision vectors $H^{(j)}$, where $j=p+1, p+2, \ldots, n-1$ to the decision vector $H^{(p)}$.

Second Preferred Embodiment of the RS Decoder

In the first preferred embodiment, the error-trial values are added to a symbol being under error checking in a sequential order, i.e. one during each error-trial step in the error-checking process. The time required for one error-checking process could be as long as n clock cycles or as short as only one clock cycle. To boost up the overall processing speed, the error-trial values are designed to be added simultaneously to the syndrome values $\{S_1^{(j)}, S_2^{(j)}, \ldots, S_t^{(j)}\}$ in the second preferred embodiment of the RS decoder.

Figure 21:
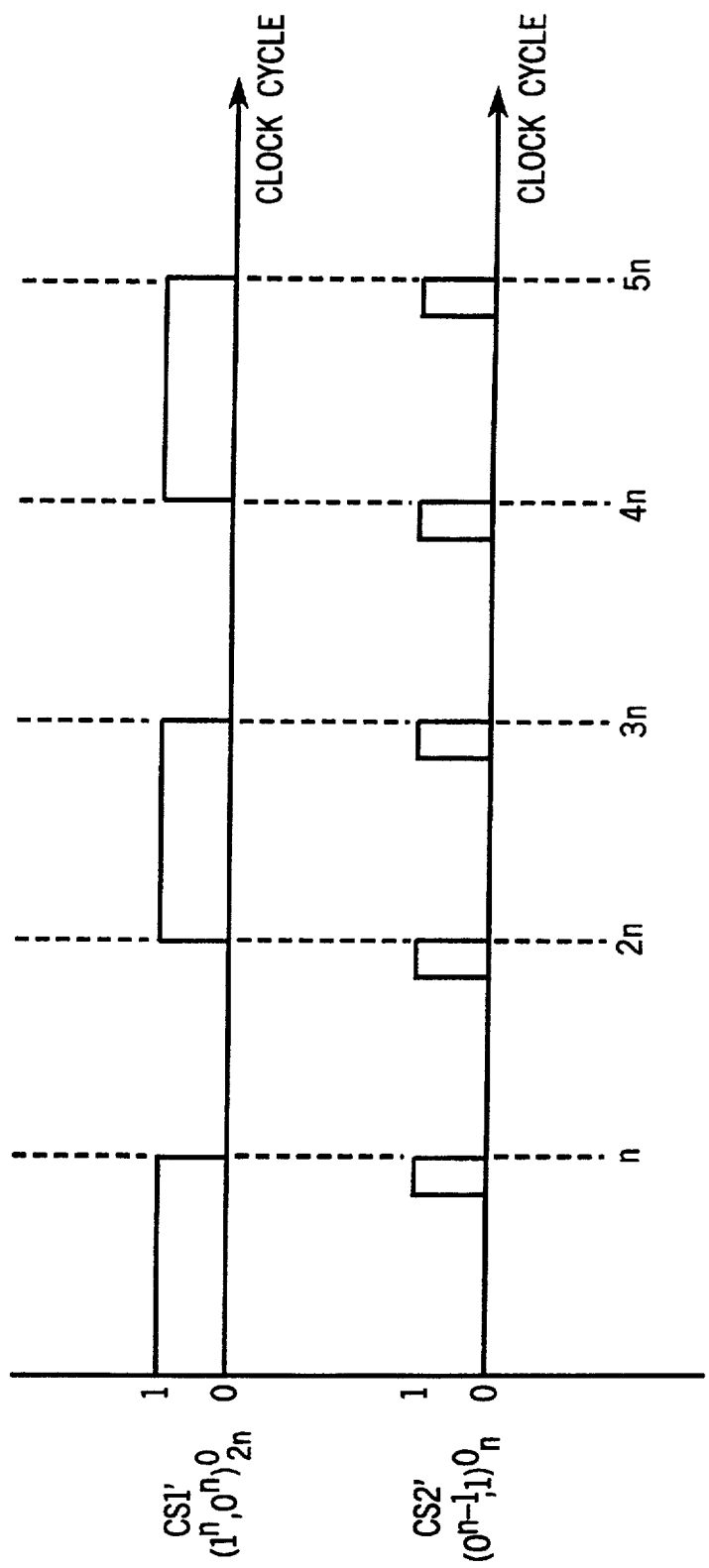
FIG. 21 shows the timing diagram of a control sequence $CS_1'$ and a control sequence $CS_2'$ utilized in the RS decoder of FIG. 18.

Before describing the second preferred embodiment, the following denotations will be introduced first. A bit sequence represented herein and hereinafter by $$(1^t, 0^{n-t})_n$$

denotes a periodical bit sequence having a period of n bits. The timing of a bit sequence $$CS_1' = (1^n, 0^n)_{2n}^0$$

and a bit sequence $$CS_2' = (0^{n-1}, 1)_n^0$$

relative to the system clock cycle is shown in FIG. 21.

Figure 18:
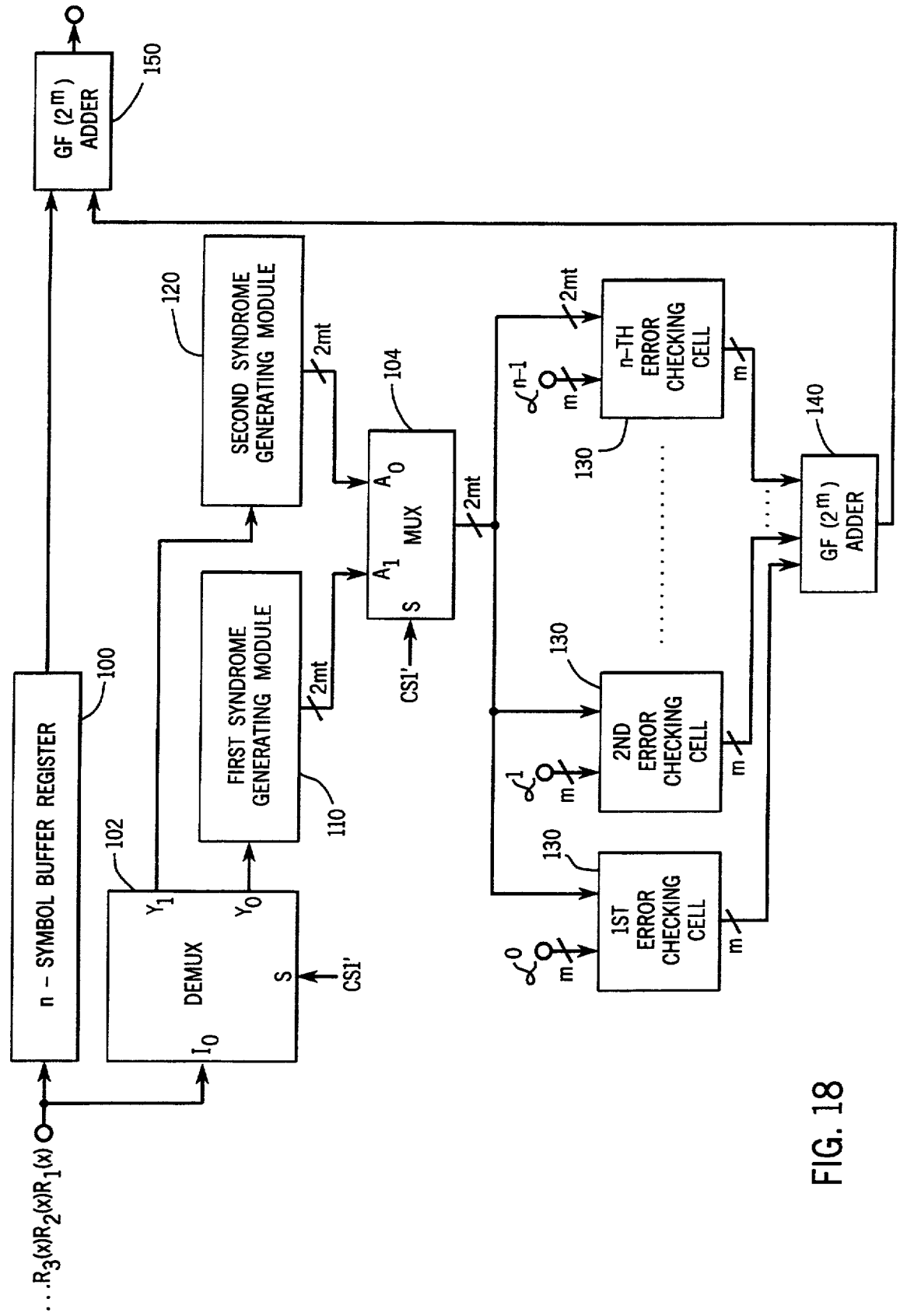
FIG. 18 shows the block diagram of a second preferred embodiment of the decoder configured for performing the decoding method of the present invention.

Referring to FIG. 18, the second preferred embodiment of the RS decoder comprises a buffer register 100, a first syndrome generator 110, a second syndrome generator 120, and an array of n error-trial cells 130. The input port of the first syndrome generator 110 and that of the second syndrome generator 120 are coupled via a demultiplexer 102 to the input of the received words. When a bit 0 is presented to the selection port s of the demultiplexer 102, the signal appearing at the input port $I_0$ is delivered to the output port $Y_0$; and when the bit is 1, the same signal is delivered to the output port $Y_1$. The control sequence $CS_1'$ is used as the selection control for the demultiplexer 105 and therefore as a series of words $R_1(x), R_2(x), R_3(x), R_4(x), \ldots$ are received, the words $R_1(x), R_3(x), \ldots$ are forwarded to the first syndrome generator 110 and the words $R_2(x), R_4(x), \ldots$ are forwarded to the second syndrome generator 120.

The configuration of the first syndrome generator 110 and that of the second syndrome generator 120 are the same as the syndrome generator utilized in the first preferred embodiment shown in FIGS. 7A-7B. The difference is that in the first preferred embodiment, a group of the syndrome values $\{S_1^{(j)}, S_2^{(j)}, \ldots, S_{2t}^{(j)}\}$, $1 \leq j \leq n-1$ are generated only when the shift control signal SHIFT is received by the LFSR circuits; while in the second preferred embodiment, the groups of the syndrome values are generated during each clock cycle following the generation of the syndromes $\{S_1^{(0)}, S_2^{(0)}, \ldots, S_{2t}^{(0)}\}$. In this manner, when the first received word $R_1(x)$ is passed to the first syndrome generator 110, it takes n clock cycles for the generation of the syndromes $\{S_1^{(0)}, S_2^{(0)}, \ldots, S_{2t}^{(0)}\}$ and another $n-1$ clock cycles for the generation of the syndromes $\{S_1^{(j)}, S_2^{(j)}, \ldots, S_{2t}^{(j)}\}$, for $j = 1,2 \ldots, n-1$. In order to synchronize the two processes, an idle clock cycle is added after the last group of syndromes values, i.e. $\{S_1^{(n-1)}, S_2^{(n-1)}, \ldots, S_{2t}^{(n-1)}\}$ are generated. In this manner, during the time the first syndrome generator 110 completes the generation of the syndromes $\{S_1^{(0)}, S_2^{(0)}, \ldots, S_{2t}^{(0)}\}$, the second received word $R_2(x)$ is passed to the second syndrome generator 120 and thus the generation of the syndromes $\{S_1^{(j)}, S_2^{(j)}, \ldots, S_{2t}^{(j)}\}$, $j = 1,2, \ldots n-1$ of the first received word $R_1(x)$ and the generation of the syndromes $\{S_1^{(0)}, S_2^{(0)}, \ldots, S_{2t}^{(0)}\}$ of the second received word $R_2(x)$ are performed concurrently.

The outputs of the first syndrome generator 110 and the outputs of the second syndrome generator 120 are coupled to a multiplexer 104 in such a manner that during a duration of n clock cycles the n groups of syndromes $\{S_1^{(0)}, S_2^{(0)}, \ldots, S_{2t}^{(0)}\}$ and $\{S_1^{(j)}, S_2^{(j)}, \ldots, S_{2t}^{(j)}\}$ $j = 1,2, \ldots, n-1$ of the first received word $R_1(x)$ are sent to each of the error-checking cells 130; and thereafter during the subsequent n clock cycles the same n groups of syndromes of the second received word $R_2(x)$ are sent to each of the error-checking cells 130.

Figure 19:
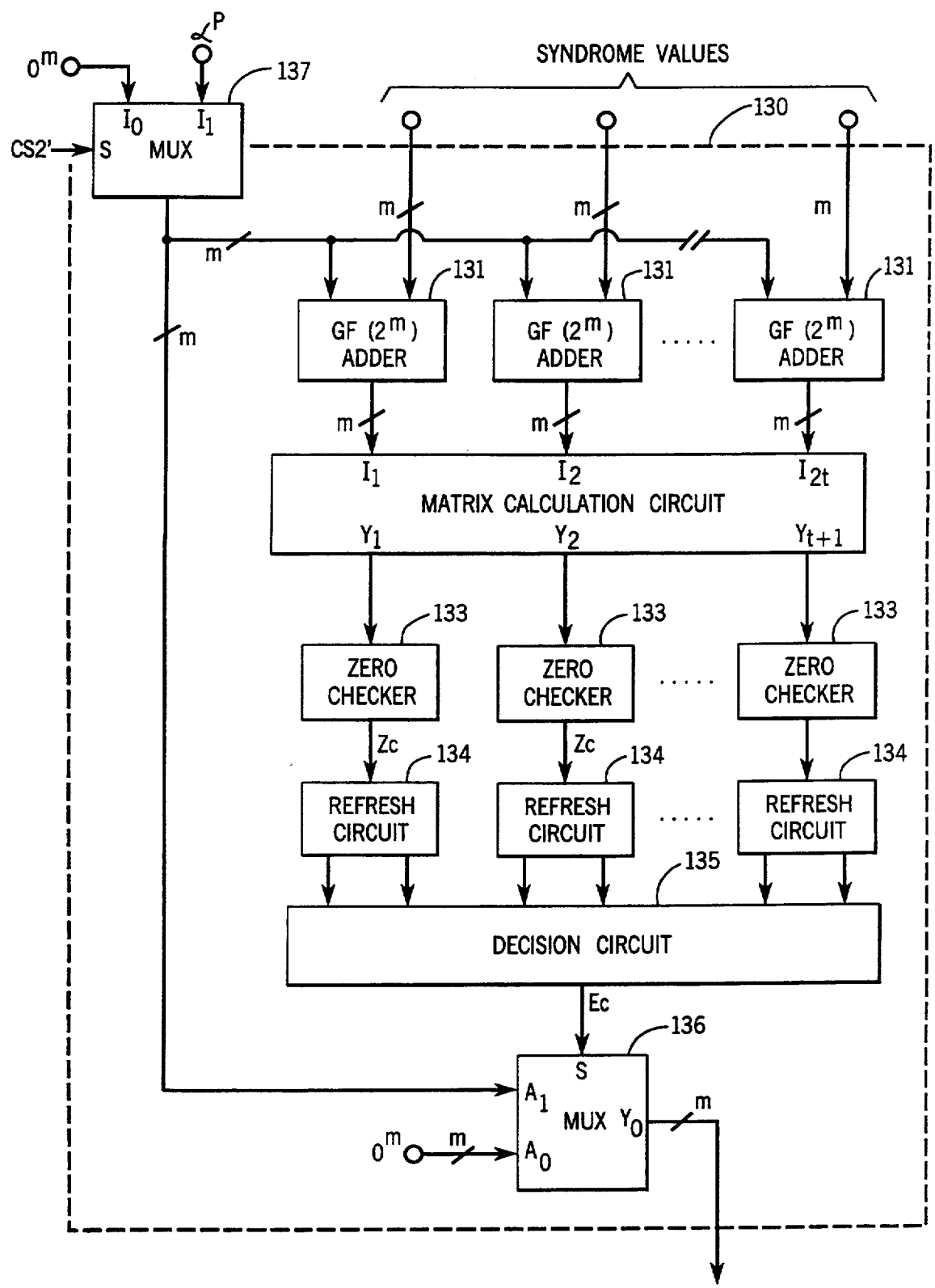
FIG. 19 shows the configuration of an error-checking cell utilized in the RS decoder of FIG. 18.
Figure 20:
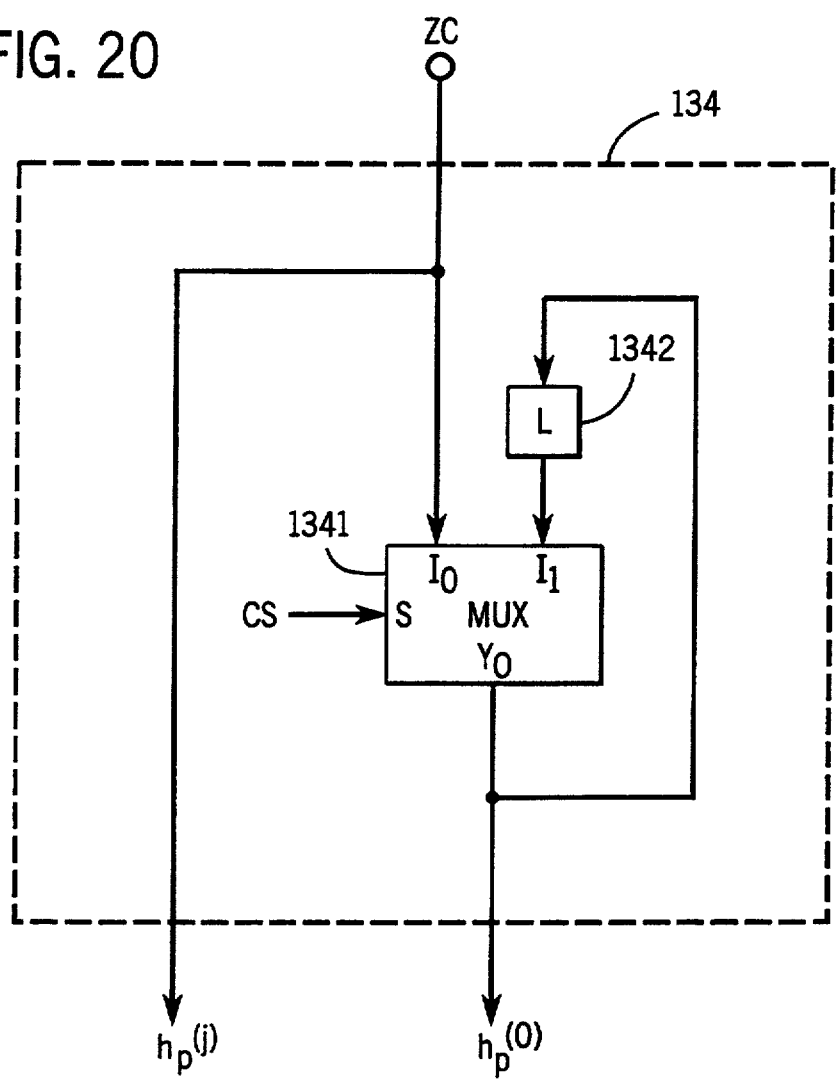
FIG. 20 shows the configuration of a refresh circuit utilized in the error-checking cell of FIG. 19.

Referring to FIG. 19, each of the error-trial cells 130 comprises an array of t $GF(2^m)$ adders 131, a matrix calculation circuit 132, an array of t zero checkers 133, an array of t refresh circuit 134, and a decision circuit 135. The configuration of the decision circuit 135 is all the same as that of the first decision circuit 50 utilized in the first preferred embodiment of the RS decoder. Since the second preferred embodiment performs the error-trial steps concurrently, there is only one clock cycle needed in each error-checking process of a symbol. Therefore, the STEP (12) in the decoding method described before can be eliminated. As a consequence, the refresh circuit 134 utilized herein can be simplified to the configuration shown in FIG. 20. When the output signal $E_C$ of the decision circuit is a bit 1, the fixed input of the $GF(2^m)$ element utilized as the error-trial value is selected by the multiplexer 136 as the output of the error-checking cell 130.

If the symbol $r_{n-p}$ undergoing error checking is a correct symbol, each of the decision circuit 135 in the n error-checking cells sends out a bit 0 which causes the multiplexer 136 to select the 0 input as the output of the error-checking cell 130. As a consequence, the output of the $GF(2^m)$ adder 140 is a zero value such that no correcting action is performed on the symbol $r_{n-p}$. On the other hand, if the symbol $r_{n-p}$ undergoing error checking is an erroneous symbol with a symbol error value $\beta$, then only the decision circuit that is disposed in the error-trial cells whose associated error-trial value, say $\alpha^q$, is equal to $\beta$ sends out a bit 1 and the rest of the decision circuit sends out a bit 0. As a consequence, the error-trial value $\alpha^q$ is forwarded via the $GF(2^m)$ adder 140 to the $GF(2^m)$ adder 150 such that the error-trial value $\alpha^q$ is added to the symbol $r_{n-p}$.

Using the configuration of the second preferred embodiment, the time needed for the decoding of N received words is Time = $n + n \cdot N = n \cdot (N+1)$, which is less than that needed by the first preferred embodiment. The circuit of the second preferred embodiment, though, has a larger complexity than that of the first preferred embodiment.

The present invention has been described hitherto with exemplary preferred embodiments. However, it is to be understood that the scope of the present invention need not be limited to the disclosed preferred embodiments. On the contrary, it is intended to cover various modifications and similar arrangements within the scope defined in the following appended claims. The scope of the claims should be accorded the broadest interpretation so as to encompass all such modifications and similar arrangements.

What is claimed is:

1. In a system having digital information encoded into t-error-correcting (n,k) Reed-Solomon codewords which are transmitted from one site and received at another site, a decoder for correcting symbol errors which occur during transmission of the digital information, the received digital information comprising a series of received words, each received word being represented by a polynomial R(x) and having an error pattern E(x), and each word comprising n symbols and each symbol comprising m bits, said decoder comprising:

a shift register to shift the symbols constituting the received word R(x) to form a group of shifted words $R^{(j)}(x)$, $j = 1, 2, \ldots n-1$;

an error-trial value generator coupled to the shift register to generate a series of error-trial values $\alpha^s$, $s = 0, 1, 2, \ldots n-1$;

an adder array coupled to the error-trial value generator to add each of the error-trial values $\alpha^s$, $s = 0, 1, 2, \ldots n-1$ to a predetermined symbol of each of the shifted words $R^{(j)}(x)$, $j = 1, 2, \ldots n-1$ to form a group of error-trial words $R^{(j)}(x)$, $j = 1, 2, \ldots n-1$;

a syndrome generator coupled to the adder array for calculating syndrome values $S_i^{(0)}$, $i = 1, 2, \ldots 2t$ of the received word R(x) to form a plurality of matrices $N_1^{(0)}, N_2^{(0)}, \ldots N_t^{(0)}, N_{n+t}^{(0)}$, and for calculating syndrome values $S_i^{(j)}$, $i = 1, 2, \ldots 2t$ of the error-trial words $R^{(j)}(x)$, $j = 1, 2, \ldots N-1$ to form a plurality of matrices $N_1^{(j)}, N_2^{(j)}, \ldots N_t^{(j)}, N_{n+t}^{(j)}$;

a matrix calculation circuit coupled to the adder array for calculating determinants $\det(N_p^{(0)})$, $p = 1, 2, \ldots t$ and $\det(N'_{t+1}^{(0)})$ from the plurality of matrices $N_1^{(0)}, N_2^{(0)}, \ldots N_t^{(0)}, N_{n+t}^{(0)}$ and determinants $\det(N_p^{(j)})$, $p = 1, 2, \ldots t$ and $\det(N'_{t+a}^{(j)})$ from the plurality of matrices $N_1^{(j)}, N_2^{(j)}, \ldots N_t^{(j)}, N_{n+t}^{(j)}$;

a zero checker coupled to the matrix calculation circuit for determining a zeroness of the determinants $\det(N_p^{(0)})$ for $p = 1, 2, \ldots t$ and $\det(N'_{t+1}^{(0)})$, and the determinants $\det(N_p^{(j)})$ for $p = 1, 2, \ldots t$ and $\det(N'_{t+1}^{(j)})$ for $j = 1, 2, \ldots n-1$;

a refresh circuit coupled to the zero checker for determining a weight of the error pattern E(x) of the received word R(x) in accordance with the zeroness of the determinants $\det(N_p^{(0)})$, $p = 1, 2, \ldots t$ and $\det(N'_{t+1}^{(0)})$ and for determining weights of an error pattern of the error-trial words $R^{(j)}(x)$, $j = 1, 2, \ldots n-1$ in accordance with the zeroness of the determinants $\det(N_p^{(j)})$, $p = 1, 2, \ldots t$ and $\det(N'_{t+1}^{(j)})$ wherein said determining is based upon a correcting signal and a control sequence signal;

a decision circuit coupled to the refresh circuit for comparing the weight of the error pattern E(x) of the received word R(x) with the weights of the error patterns of the error-trial words $R^{(j)}(x)$, $j = 1, 2, \ldots n-1$ and for outputting the correcting signal and the control sequence signal; and a logic circuit responsive to said correcting signal from a decision circuit for correcting an erroneous symbol of the received word.

2. A decoder according to claim 1 wherein the error-trial value generator is used in the determination of the syndrome values $S_i^{(j)}$, $i = 1, 2, \ldots, 2t$ of the error-trial words $R^{(j)}(x)$, $j = 1, 2, \ldots n-1$, said error-trial value generator adding each of the error-trial values $\alpha^s$, $s = 0, 1, 2, \ldots n-1$ to the syndrome values $S_i^{(j)}$, $i = 1, 2, \ldots, 2t$ of the shifted words $R^{(j)}(x)$, $j = 1, 2, \ldots, n-1$ in a predetermined sequential order.

3. A decoder according to claim 1, wherein an array of n error-checking cells are used in the determination of the syndrome values $S_i^{(j)}$, $i = 1, 2, \ldots, 2t$ of the error-trial words $R^{(j)}(x)$, $j = 1, 2, \ldots n-1$, said error-checking cells adding each of the error-trial values $\alpha^s$, $s = 0, 1, 2, \ldots n-1$ to the syndrome values $S_i^{(j)}$, $i = 1, 2, \ldots, 2t$ of the shifted words $R^{(j)}(x)$, $j = 1, 2, \ldots, n-1$ concurrently.

* * * * *